(12) United States Patent
Kubo et al.

(10) Patent No.: US 11,170,999 B2
(45) Date of Patent: Nov. 9, 2021

(54) DEPOSITION METHOD

(71) Applicant: Tokyo Electron Limited, Tokyo (JP)

(72) Inventors: Kazumi Kubo, Iwate (JP); Yutaka Takahashi, Iwate (JP); Takayuki Karakawa, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/751,440

(22) Filed: Jan. 24, 2020

(65) Prior Publication Data

US 2020/0251326 A1 Aug. 6, 2020

(30) Foreign Application Priority Data

Feb. 1, 2019 (JP) .............................. JP2019-017374

(51) Int. Cl.
*H01L 21/02* (2006.01)

(52) U.S. Cl.
CPC .... *H01L 21/0234* (2013.01); *H01L 21/02123* (2013.01); *H01L 21/02263* (2013.01)

(58) Field of Classification Search
CPC ........... H01L 21/0234; H01L 21/02123; H01L 21/02263; H01L 21/68771; H01L 21/0228; H01L 21/0217; H01L 21/02274; H01L 21/02211; C23C 16/5096; C23C 16/45519; C23C 16/45565; C23C 16/452; C23C 16/45591; C23C 16/045; C23C 16/345; C23C 16/4554; C23C 16/45534; C23C 16/45551; C23C 16/04; H01J 37/32449
See application file for complete search history.

(56) References Cited

U.S. PATENT DOCUMENTS

| | | | |
|---|---|---|---|
| 2003/0037457 A1* | 2/2003 | Bailey | ................. H01L 21/6875 34/232 |
| 2007/0269982 A1 | 11/2007 | Rocklein et al. | |
| 2013/0171822 A1 | 7/2013 | Chandrashekar et al. | |
| 2014/0213037 A1 | 7/2014 | LiCausi et al. | |
| 2017/0125238 A1 | 5/2017 | Hasebe et al. | |
| 2018/0237912 A1* | 8/2018 | Takahashi | ........... C23C 16/0272 |

FOREIGN PATENT DOCUMENTS

| | | |
|---|---|---|
| JP | 2013-135154 | 7/2013 |
| JP | 2017-092098 | 5/2017 |

* cited by examiner

*Primary Examiner* — Yasser A Abdelaziez
(74) *Attorney, Agent, or Firm* — IPUSA, PLLC

(57) ABSTRACT

A deposition method includes forming a nitride film on a surface of a substrate; and performing, after the depositing, plasma purging supplying a noble gas activated as a plasma. The forming of the nitride film includes a) forming adsorption inhibitors on the surface of the substrate, by supplying a chlorine gas activated by a plasma and by causing the activated chlorine gas to be adsorbed on the surface of the substrate; b) causing a raw material gas, containing silicon and chlorine or a metal and chlorine, to be adsorbed on a region in the surface of the substrate on which the adsorption inhibitors are not present, by supplying the raw material gas on the surface of the substrate; and c) depositing the nitride film on the surface of the substrate, by supplying a nitriding gas to cause the raw material gas to be reacted with the nitriding gas.

13 Claims, 17 Drawing Sheets

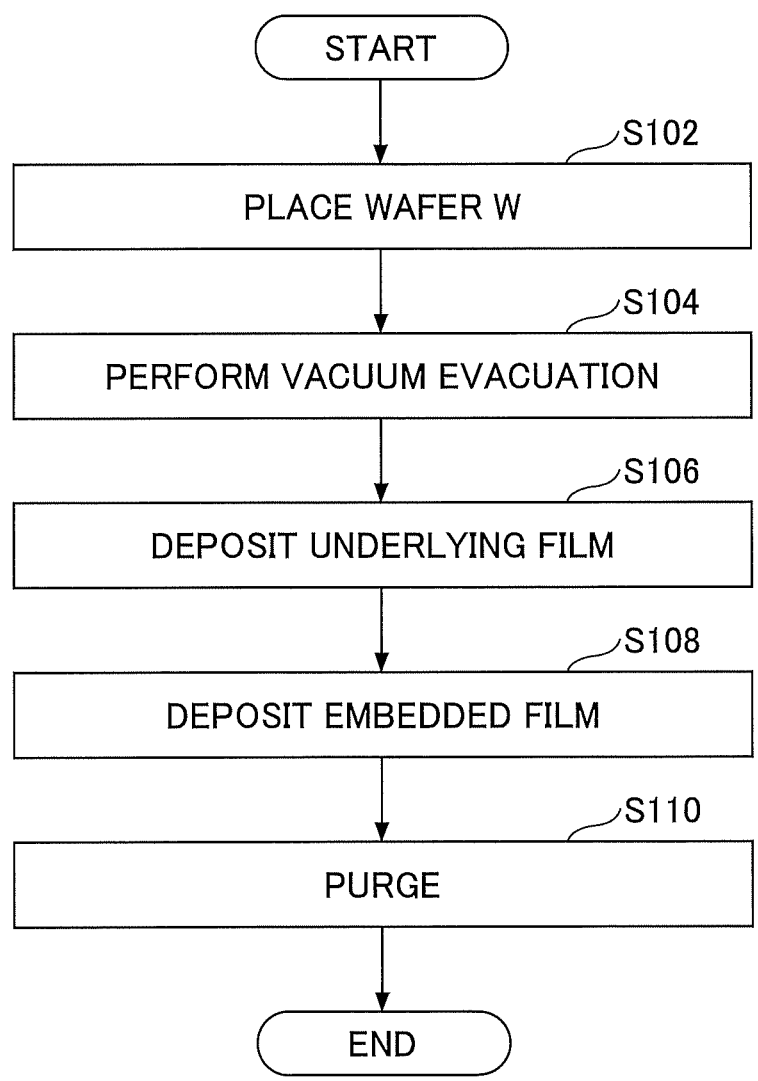

DEPOSITION METHOD

CROSS-REFERENCE TO RELATED APPLICATIONS

This patent application is based upon and claims priority to Japanese Patent Application No. 2019-017374 filed on Feb. 1, 2019, the entire contents of which are incorporated herein by reference.

TECHNICAL FIELD

The present disclosure relates to a deposition method.

BACKGROUND

Conventionally, a method of depositing a silicon oxide film on a recess formed on a substrate is known, which includes a step of causing a hydroxyl group to be adsorbed on an inner surface of the recess formed on the substrate with a desired distribution, a step of supplying an organic aminosilane gas to cause the organic aminosilane gas to be adsorbed to the substrate on which the hydroxyl group is adsorbed, and a step of supplying an oxidized gas to the substrate on which the organic aminosilane gas is adsorbed (see Patent Document 1, for example).

According to this deposition method, by controlling the adsorption distribution of the hydroxyl group, a film can be formed with a desired film thickness distribution, and film deposition can be carried out in accordance with its application, such as film deposition with high bottom-up property, or conformal film deposition in a shape of a recess.

CITATION LIST

Patent Document

[Patent Document 1] Japanese Laid-open Patent Application Publication No. 2013-135154

Meanwhile, due to densification and diversification of semiconductor integrated circuits, the above-described film deposition having high bottom-up property is required in not only depositing a silicon oxide film but also depositing other types of films such as a nitride film. Specifically, there is a need for a deposition method for a nitride film in which a film thickness is substantially uniform and reproducible even when film deposition of nitride films is repeated.

SUMMARY

According to one aspect of an embodiment of the present disclosure, a deposition method includes forming a nitride film on a surface of a substrate; and performing, after the depositing, plasma purging supplying a noble gas activated as a plasma. The forming of the nitride film includes a step of forming adsorption inhibitors on the surface of the substrate, by supplying a chlorine gas activated as a plasma and by causing the activated chlorine gas to be adsorbed on the surface of the substrate; a step of causing a raw material gas, containing silicon and chlorine or a metal and chlorine, to be adsorbed on a region in the surface of the substrate on which the adsorption inhibitors are not present, by supplying the raw material gas on the surface of the substrate; and a step of depositing the nitride film on the surface of the substrate, by supplying a nitriding gas to cause the raw material gas to be reacted with the nitriding gas.

BRIEF DESCRIPTION OF THE DRAWINGS

FIG. 11 is a flowchart illustrating an example of a film-forming method using the deposition apparatus;

DETAILED DESCRIPTION OF EMBODIMENTS

Hereinafter, an embodiment for carrying out the present invention will be described with reference to the drawings. With respect to the same members, the same reference symbols are attached, and duplicate descriptions are omitted.

(Deposition Apparatus)

Figure 1:
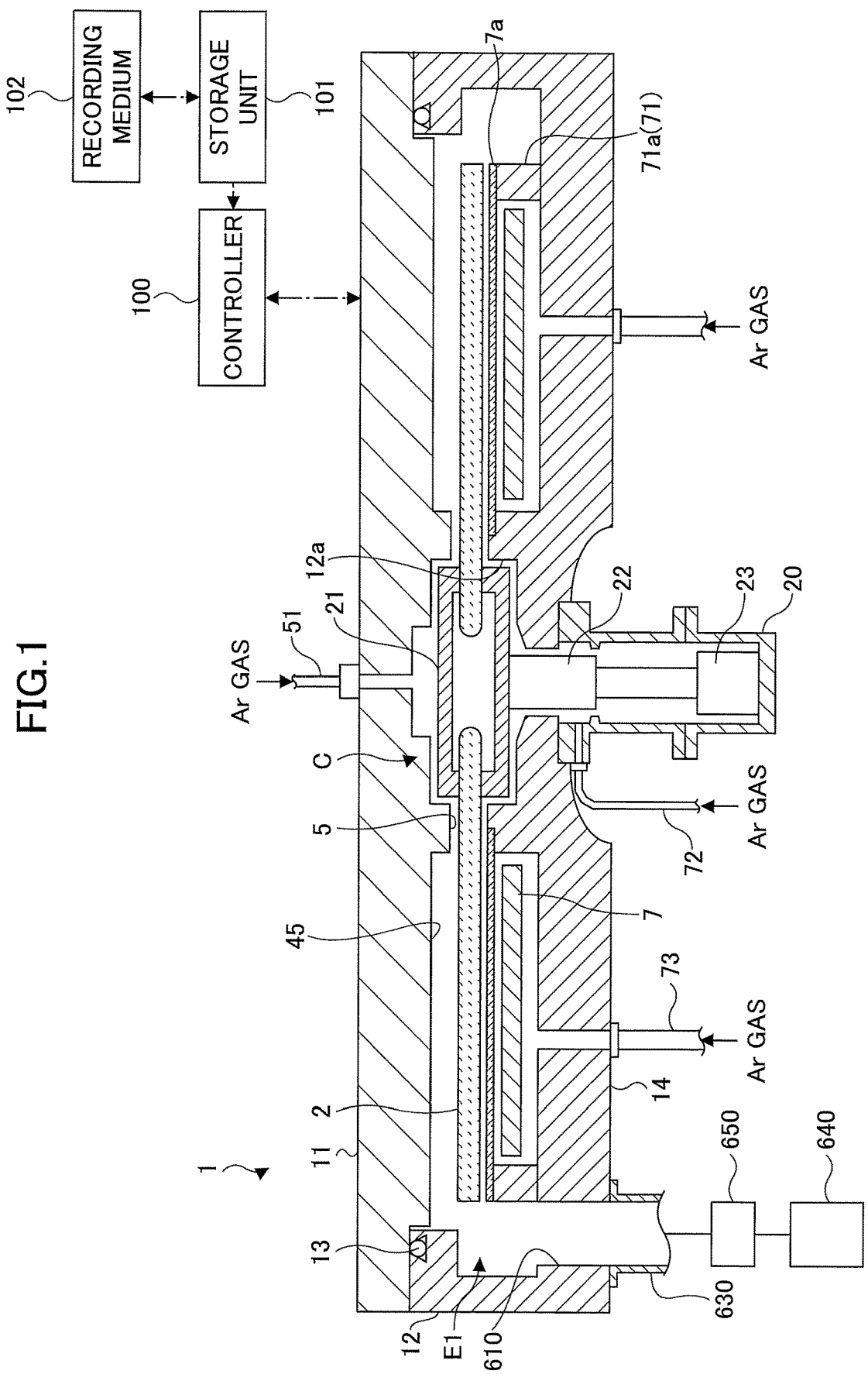
FIG. 1 is a schematic cross-sectional view of a deposition apparatus used in an embodiment.
Figure 2:
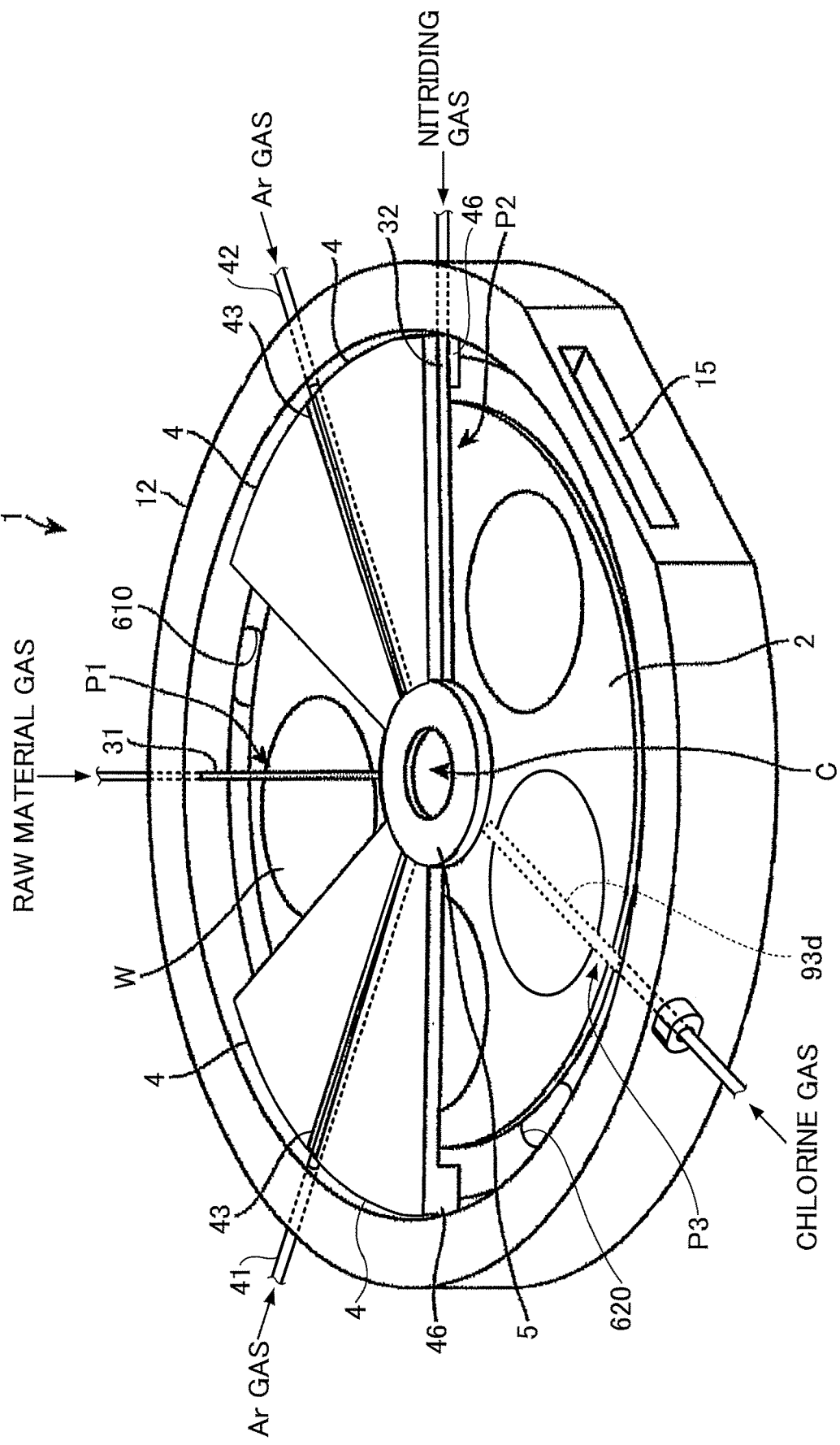
FIG. 2 is a schematic perspective view illustrating a configuration in a vacuum vessel of the deposition apparatus used in the present embodiment.
Figure 3:
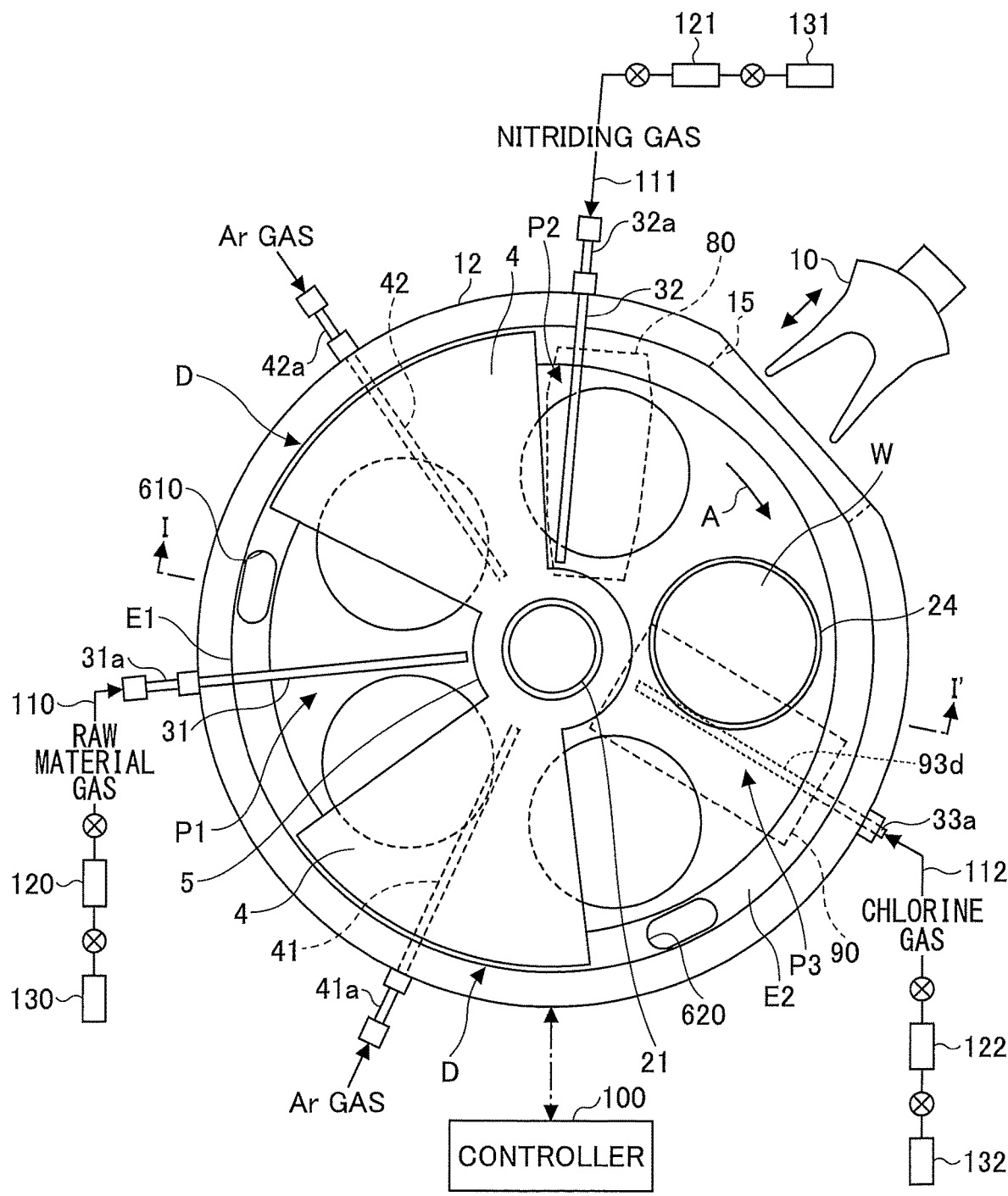
FIG. 3 is a schematic plan view illustrating the configuration in the vacuum vessel of the deposition apparatus used in the present embodiment.

First, a deposition apparatus used in a deposition method according to the present embodiment will be described. As illustrated in FIGS. 1 to 3, the deposition apparatus according to the present embodiment includes a flat vacuum vessel 1 having a substantially circular planar shape, and a rotary table 2 disposed within the vacuum vessel 1 having a rotational center at a center of the vacuum vessel 1. The vacuum vessel 1 is a processing chamber for applying a deposition process to a surface of a wafer that is loaded in the vacuum vessel 1. The vacuum vessel 1 includes a vessel body 12 having a cylindrical shape including a bottom portion, and a top plate 11 which is removably disposed at the top surface of the vessel body 12. Because the top plate 11 is attached to the vessel body 12 via a seal member 13 (FIG. 1) such as an O-ring, the vacuum vessel 1 is hermetically sealed by the seal member 13.

The rotary table 2 is fixed to a cylindrical core 21 at the center of the rotary table 2. The core 21 is fixed to an upper end of a rotating shaft 22 extending vertically. The rotating shaft 22 passes through a bottom portion 14 of the vacuum vessel 1, and a lower end of the rotating shaft 22 is attached to an actuating unit 23 which rotates the rotating shaft 22 (FIG. 1) about the vertical axis. The rotating shaft 22 and the actuating unit 23 are housed in a cylindrical casing 20 having an open upper surface. The casing 20 is hermetically mounted on a bottom surface of the bottom portion 14 of the vacuum vessel 1 at a flange portion provided on an upper surface of the casing 20, and the internal atmosphere of the casing 20 is isolated from the external atmosphere.

As illustrated in FIG. 2 and FIG. 3, multiple circular recesses 24 are provided on a surface of the rotary table 2 (five recesses 24 are provided in the drawings) along a rotating direction (circumferential direction). Each of the recesses 24 is used for placing a semiconductor wafer (hereinafter referred to as a "wafer") W, which is a substrate such as a silicon substrate. For convenience, FIG. 3 illustrates a case in which a wafer W is placed on only one of the recesses 24. The recess 24 has an inner diameter slightly larger (4 mm larger for example) than a diameter of the wafer W, and has a depth that is approximately equal to a thickness of the wafer W. Thus, when the wafer W is placed in the recess 24, the surface of the wafer W and the surface of the rotary table 2 (an area on which the wafer W is not placed) become the same level. On a bottom surface of the recess 24, through-holes, through which three lift pins penetrate for example, are provided (the through-holes and the lift pins are not illustrated in the drawings). The lift pins support the back surface of the wafer W to raise and lower the wafer W.

FIGS. 2 and 3 are diagrams for illustrating a structure inside the vacuum vessel 1, and for the sake of description, illustration of the top plate 11 is omitted. As illustrated in FIGS. 2 and 3, a reactant gas nozzle 31, a reactant gas nozzle 32, a gas discharge section 93d of a remote plasma generator 90, which will be described below, and separation gas nozzles 41 and 42, each of which is made of quartz, are arranged at intervals in the circumferential direction of the vacuum vessel 1 (rotating direction of the rotary table 2 (arrow A in FIG. 3)). In the illustrated example, the gas discharge section 93d of the remote plasma generator 90, the separation gas nozzle 41, the reactant gas nozzle 31, the separation gas nozzle 42, and the reactant gas nozzle 32 are arranged in this order clockwise (in the rotating direction of the rotary table 2) from a conveying port 15 to be described below. These nozzles 31, 32, 41, and 42 are introduced from an outer circumferential wall of the vacuum vessel 1 into the vacuum vessel 1 by fixing gas inlet ports 31a, 32a, 41a, and 42a (FIG. 3), which are extreme ends of the respective nozzles 31, 32, 41, and 42, to the outer circumferential wall of the vessel body 12, and are installed to extend horizontally with respect to the rotary table 2 along a radial direction of the vessel body 12. Note that a gas supply line 92 of the remote plasma generator 90 connected to the gas discharge section 93d to be described below may be connected to a gas inlet port 33a.

In the present embodiment, as illustrated in FIG. 3, the reactant gas nozzle 31 is connected to a raw material gas supply source 130, such as through a pipe 110 and a flow controller 120. The reactant gas nozzle 32 is connected to a nitriding gas supply source 131, such as through a pipe 111 and a flow controller 121. Further, the gas supply line 92 of the remote plasma generator 90 is connected to a chlorine ($Cl_2$) gas supply source 132, such as through a pipe 112 and a flow controller 122. Both the separation gas nozzles 41 and 42 are connected to a source of separation gas (not illustrated), such as through pipes and flow control valves (not illustrated). As the separation gas, a noble gas such as helium (He) or argon (Ar), or an inert gas such as nitrogen ($N_2$) gas can be used. In the present embodiment, an example of using Ar gas will be described.

Figure 4:
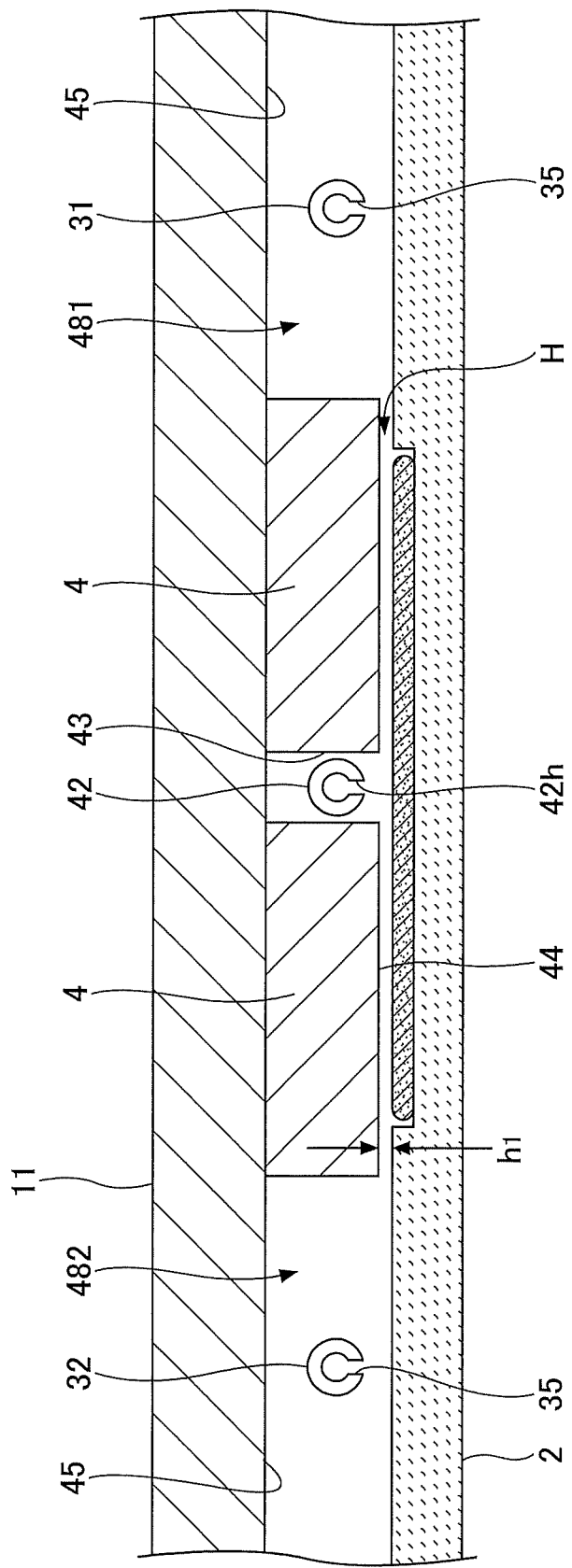
FIG. 4 is a schematic cross-sectional view of the vacuum vessel taken along a concentric circle of a rotary table of the deposition apparatus used in the present embodiment.

As illustrated in FIG. 4, in the reactant gas nozzles 31 and 32, multiple gas discharge holes 35 facing the rotary table 2 are arranged at intervals of 10 mm, for example, along a longitudinal direction of the reactant gas nozzles 31 and 32. As illustrated in FIGS. 2 and 3, a region below the reactant gas nozzle 31 is a first processing region P1 used for causing the wafer W to adsorb a raw material gas. A region below the reactant gas nozzle 32 is a second processing region P2 used for supplying a nitriding gas that produces a nitride film by nitriding the raw material gas adsorbed on the wafer W. A region below the gas discharge section 93d of the remote plasma generator 90 is a third processing region P3 in which adsorption inhibitors are generated by supplying a plasma-activated chlorine gas to the reaction product (nitride film) generated in the second processing region P2. In the present application, because the first processing region P1 is a region supplying the raw material gas, the first processing region P1 may be referred to as a raw material gas supply region P1. Similarly, because the second processing region P2 is a region supplying the nitriding gas capable of producing nitride by reacting with the raw material gas, the second processing region P2 may be referred to as a nitriding gas supply region P2. Also, because the third processing region P3 is a region supplying the chlorine gas, the third processing region P3 may be referred to as a chlorine gas supply region P3.

A plasma generator 80 is provided above the second processing region P2, and a remote plasma generator 90 is provided above the third processing region P3. In FIG. 3, the plasma generator 80 and the remote plasma generator 90 are illustrated in simplified forms, with dashed lines. Details of the plasma generator 80 and the remote plasma generator 90 are described below.

As the raw material gas, a gas containing silicon and chlorine or a gas containing a metal and chlorine is selected. For example, when a silicon nitride (SiN) film is formed, a gas containing silicon and chlorine such as dichlorosilane (DCS, $SiH_2Cl_2$) is selected. Further, when a metal nitride film such as a titanium nitride (TiN) film or an aluminum nitride (AlN) film is formed, a gas containing a metal and chlorine, such as titanium tetrachloride ($TiCl_4$) or aluminum trichloride ($AlCl_3$), is selected as a raw material gas.

In general, as the nitriding gas, a gas containing ammonia ($NH_3$) is selected. Alternatively, a gas containing nitrogen ($N_2$) may be selected in a case in which a nitriding gas is supplied by activation by plasma. The nitriding gas may contain a carrier gas such as Ar in addition to ammonia.

The chlorine gas supplied from the gas discharge section 93d has a role of forming adsorption inhibitors on the surface of the wafer that prevents the raw material gas supplied from the first reactant gas nozzle 31 from being adsorbed on the wafer. For example, in a case in which a recess pattern, such as a via or a trench, is formed on a surface of a wafer, by forming adsorption inhibitors on the surface of the wafer and on an upper portion of the recess pattern, a deposited film does not become thick at the upper portion of the recess pattern, and a film deposited on the bottom side becomes thick. This makes it possible to form a film with high bottom-up property. A raw material gas is nitrided to terminate with an amino group of $NH_2$ structure, and an adsorption site with respect to the raw material gas is formed. However, when activated chlorine is supplied, a hydrogen atom (H) in the $NH_2$ structure is replaced by a chlorine atom (Cl). As described above, because the raw material gas contains chlorine and chlorines are not adsorbed with each other, the raw material gas is not adsorbed to a part terminated with chlorine. Thus, the part terminated with chlorine functions as an adsorption inhibitor, and inhibits adsorption of the raw material gas. Note that because the activated chlorine gas easily reaches the surface of the wafer W and an upper portion of the recess pattern, chlorine is adsorbed to the surface of the wafer W and the upper portion of the recess pattern more easily. However, because the activated chlorine gas does not reach a lower portion and a bottom of the recess pattern, density of chlorine gradually decreases toward the bottom of the recess pattern. Accordingly, adsorption inhibitors are formed at high density on the upper portion of the recess pattern and on the surface of the wafer, while adsorption inhibitors are formed at low density on the lower portion (or bottom) of the recess pattern. As a result, the raw material gas can be adsorbed to the lower portion more than the surface and the upper portion of the wafer W, and bottom-up film deposition, in which film deposition starts at the bottom of the recess pattern, becomes possible. Note that a gas supplied from the gas discharge section 93d may include a carrier gas such as Ar, in addition to the chlorine gas.

Referring to FIGS. 2 and 3, two projections 4 are provided in the vacuum vessel 1. As described below, the projections 4 are attached to the bottom surface of the top plate 11 such that the projections 4 protrude toward the rotary table 2, in order to configure separation regions D with the separation gas nozzles 41 and 42. Each of the projections 4 also has a fan-like planar shape, the narrowest part of which is cut in an arc. In the present embodiment, an inner circular arc of each of the projections 4 is connected to a protruding portion 5 (to be described below), and an outer circular arc of each of the projections 4 is arranged along the inner circumferential surface of the vessel body 12 of the vacuum vessel 1.

FIG. 4 illustrates a cross-section of the vacuum vessel 1 taken along a concentric circle of the rotary table 2, from the reactant gas nozzle 31 to the reactant gas nozzle 32. As illustrated, because the projection 4 is attached to the bottom surface of the top plate 11, a flat and low ceiling surface 44 (first ceiling surface), which is a bottom surface of the projection 4, and ceiling surfaces 45 (second ceiling surface) that are higher than the ceiling surface 44 are formed in the vacuum vessel 1. The ceiling surfaces 45 are each located on both sides of the ceiling surface 44 in the circumferential direction. The ceiling surface 44 has a fan-like flat shape, the narrowest part of which is cut in an arc. Also, as illustrated, at the center of the projection 4 in the circumferential direction, a groove 43 that extends radially is formed, and the separation gas nozzle 42 is housed in the groove 43. The groove 43 is also formed on the other projection 4, in which the separation gas nozzle 41 is housed. Also, the reactant gas nozzles 31 and 32 are provided in the spaces below the high ceiling surfaces 45, respectively. The reactant gas nozzles 31 and 32 are located in a vicinity of the wafer W, which are spaced from the ceiling surfaces 45. As illustrated in FIG. 4, the reactant gas nozzle 31 is provided in a space 481 below the high ceiling surface 45 at a right side, and a reactant gas nozzle 32 is provided in a space 482 below the high ceiling surface 45 on a left side.

Also, on the separation gas nozzles 41 and 42 each of which is housed in the groove 43 of the corresponding projection 4, multiple gas discharge holes 42h (see FIG. 4) opening toward the rotary table 2 are arranged along a longitudinal direction of the separation gas nozzles 41 and 42 at intervals, for example, of 10 mm.

The ceiling surface 44 forms a separation space H, which is a narrow space, above the rotary table 2. When Ar gas is supplied from the gas discharge holes 42h of the separation gas nozzle 42, the Ar gas flows toward the space 481 and the space 482 through the separation space H. Because a volume of the separation space H is smaller than that of the spaces 481 and 482, when Ar gas flows, a pressure in the separation space H can become higher than that in the spaces 481 and 482. That is, a high pressure separation space (separation space H) is formed between the spaces 481 and 482. Also, the Ar gas flowing from the separation space H into the spaces 481 and 482 functions as a counterflow against a first reactant gas from the first processing region P1 and a second reactant gas from the second processing region P2. Therefore, the first reactant gas from the first processing region P1 and the second reactant gas from the second processing region P2 are separated by the separation space H. Accordingly, occurrence of mixing and reaction of the first reactant gas and the second reactant gas in the vacuum vessel 1 is suppressed.

It is preferable that a height h1 of the ceiling surface 44 from the upper surface of the rotary table 2 is set to a height suitable for raising the pressure in the separation space H relative to the pressures in the spaces 481 and 482, considering the pressure in the vacuum vessel 1 during deposition, rotational speed of the rotary table 2, supply amount of the separation gas (Ar gas), and the like.

On the bottom surface of the top plate 11, the protruding portion 5 (FIGS. 2 and 3) is provided so as to surround an outer circumference of the core 21 that fixes the rotary table 2. In the present embodiment, the protruding portion 5 is continuous with a portion of the projection 4 at a side of a rotational center, and a bottom surface of the protruding portion 5 is formed at the same height as the ceiling surface 44.

Figure 5:
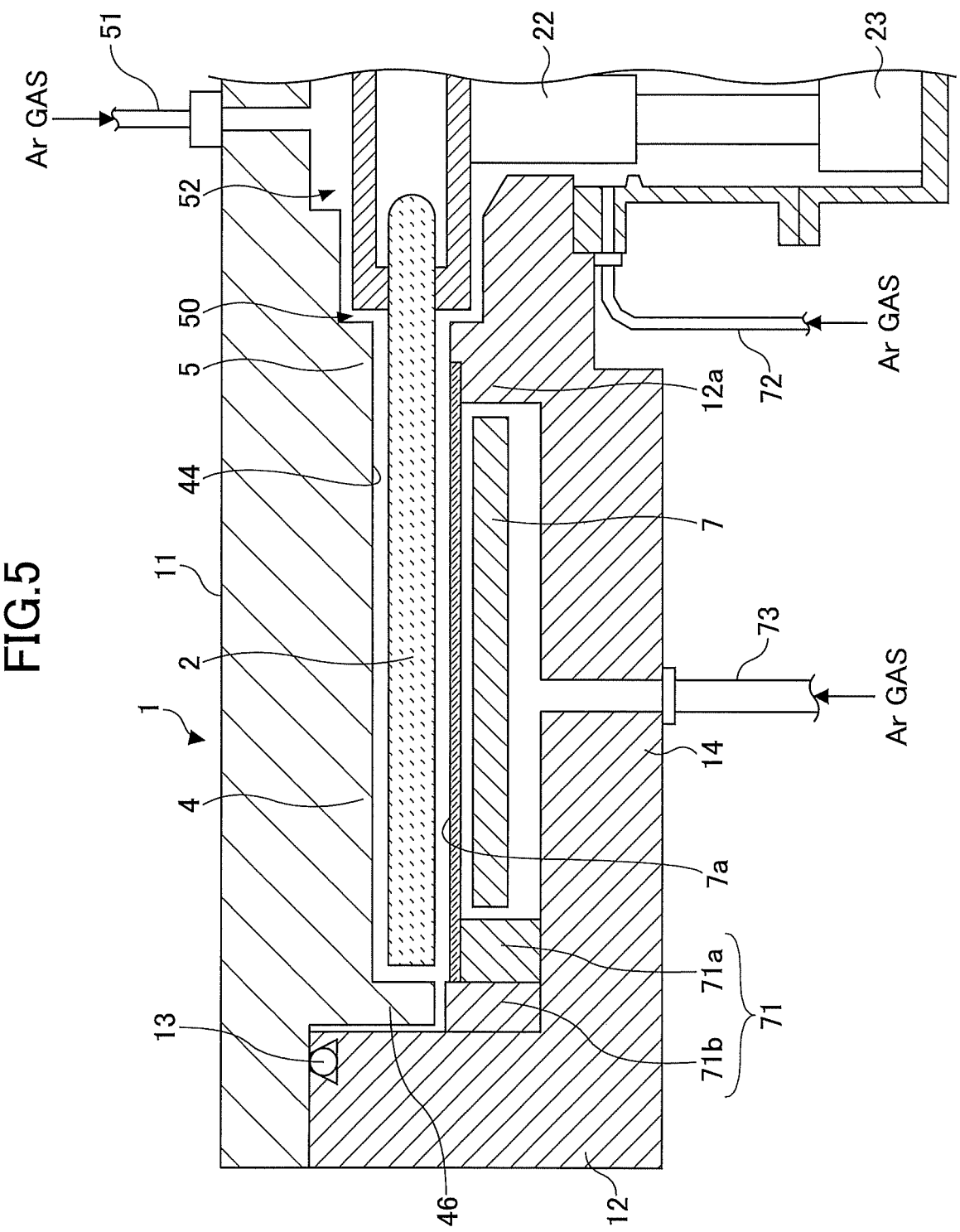
FIG. 5 is a schematic cross-sectional view of a main part of the deposition apparatus used in the present embodiment.

FIG. 1, which has been referred to above, is a cross-sectional view taken along line I-I' in FIG. 3, and FIG. 1 illustrates an area having the ceiling surface 45. In contrast, FIG. 5 is a cross-sectional view illustrating an area in which the ceiling surface 44 is provided. As illustrated in FIG. 5, at a periphery of the fan-shaped projection 4 (the side towards the outside of the vacuum vessel 1) an L-shaped bent portion 46 is formed such that the bent portion 46 faces an outer edge of the rotary table 2. The bent portion 46, similar to the projection 4, prevents the reactant gas from entering the separation region D from both sides, and thereby prevents both of the reactant gases from being mixed. Because the fan-shaped projection 4 is provided on the top plate 11 and the top plate 11 is detachable from the vessel body 12, there is a slight gap between an outer circumferential surface of the bent portion 46 and the vessel body 12. A gap between an inner circumferential surface of the bent portion 46 and the outer edge of the rotary table 2, and the gap between the outer circumferential surface of the bent portion 46 and the vessel body 12 are set, for example, to a size similar to the height of the ceiling surface 44 from the upper surface of the rotary table 2.

In the separation region D, an inner circumferential wall of the vessel body 12 is formed to be straight in a vertical direction and is close to the outer circumferential surface of the bent portion 46, as illustrated in FIG. 5. With respect to a portion other than the separation region D, as illustrated in FIG. 1, for example, the inner circumferential wall of the vessel body 12 is recessed outwardly from a location facing the outer edge of the rotary table 2 toward the bottom portion 14. For the sake of description, the recessed portion having a substantially rectangular cross-sectional shape is hereinafter referred to as an exhaust region. Specifically, the exhaust region in communication with the first processing region P1 is referred to as a first exhaust region E1, and a region in communication with the second and third processing regions P2 and P3 is referred to as a second exhaust region E2. At bottoms of these first and second exhaust regions E1 and E2, a first exhaust port 610 and a second exhaust port 620 are formed respectively, as illustrated in FIGS. 1-3. Each of the first exhaust port 610 and the second exhaust port 620 is connected to a vacuum exhaust means such as a vacuum pump 640 via an exhaust pipe 630, as illustrated in FIG. 1. Further, a pressure controller 650 is provided between the vacuum pump 640 and the exhaust pipe 630. Although only a structure of the first exhaust port 610 is illustrated in FIG. 1, a structure of the second exhaust port 620 is also similar to that of the first exhaust port 610.

As illustrated in FIGS. 2 and 3, although a separation region H is not provided between the second processing region P2 and the third processing region P3, equipment for partitioning the space over the rotary table 2 is provided at a region illustrated as a plasma generator 80 in FIG. 3. Thus, the space in the second processing region P2 is separated from the space in the third processing region P3.

In a space between the rotary table 2 and the bottom portion 14 of the vacuum vessel 1, a heater unit 7 which is a heating means is provided, as illustrated in FIGS. 1 and 5. The wafer W on the rotary table 2 is heated to a temperature (e.g., 400° C.) determined by a process recipe, via the rotary table 2. A ring-shaped cover member 71 is provided below the rotary table 2 near the circumference of the rotary table 2 such that an atmosphere extending from a space above the rotary table 2 to the exhaust regions E1 and E2 is separate from an atmosphere in which the heater unit 7 is placed, to prevent gas from entering an area below the rotary table 2 (FIG. 5). The cover member 71 includes an inner member 71a disposed at an area under the outer edge of the rotary table 2 and under a periphery of the outer edge of the rotary table 2, and an outer member 71b disposed between the inner member 71a and the inner wall surface of the vacuum vessel 1. The outer member 71b is provided, below the bent portion 46 formed at the outer edge of the projection 4 in the separation region D, in proximity to the bent portion 46, and the inner member 71a surrounds the heater unit 7 throughout its entire circumference under the outer edge of the rotary table 2 (and just outside of the outer edge).

A portion of the bottom portion 14 closer to the rotational center relative to the space accommodating the heater unit 7 extends upwardly toward a portion of the core 21 near the center of the bottom surface of the rotary table 2, to form an extending portion 12a. The space between the extending portion 12a and the core 21 is narrow, and the gap between the rotating shaft 22 passing through the bottom portion 14 and an inner peripheral surface of a through-hole of the rotating shaft 22 is also narrow. These narrow spaces communicate with the casing 20. The casing 20 is provided with a purge gas supply line 72 for supplying Ar gas serving as a purge gas to purge from the narrow spaces. Also, at the bottom portion 14 of the vacuum vessel 1, multiple purge gas supply lines 73 are provided at predetermined angular intervals below the heater unit 7, in order to purge from the space accommodating the heater unit 7 (one of the purge gas supply lines 73 is illustrated in FIG. 5). In addition, a lid member 7a is provided between the heater unit 7 and the rotary table 2 such that the lid member 7a circumferentially covers an area from the inner peripheral wall (the upper surface of the inner member 71a) of the outer member 71b to an upper end portion of the extending portion 12a, in order to prevent gas from entering the region accommodating the heater unit 7. The lid member 7a may be made of, for example, quartz.

A separation gas supply line 51 is connected to the center of the top plate 11 of the vacuum vessel 1, and is configured to supply Ar gas serving as a separation gas to a space 52 between the top plate 11 and the core 21. The separation gas supplied to the space 52 is discharged toward the periphery of the rotary table 2 along the surface of the rotary table 2 at a side on which a wafer is placed, through a narrow gap 50 between the protruding portion 5 and the rotary table 2. The gap 50 may be maintained at higher pressure than the space 481 and the space 482 by the separation gas. Accordingly, the gap 50 inhibits the raw material gas supplied to the first processing region P1 and the nitriding gas supplied to the second processing region P2 from being mixed through a central region C. That is, the gap 50 (or the central region C) can function similarly to the separation space H (or the separation region D).

Further, as illustrated in FIGS. 2 and 3, the conveying port 15 is provided at the side walls of the vacuum vessel 1, which is used for passing a wafer W (substrate) between the rotary table 2 and a conveying arm 10 located outside. The conveying port 15 is opened and closed by a gate valve (not illustrated). When the recess 24 on the rotary table 2, which is an area for placing the wafer, is positioned at a location facing the conveying port 15 (this location may be referred to as a "delivery position"), the wafer W is passed between the rotary table 2 and the conveying arm 10. Thus, the lift pins for lifting the wafer W from its bottom by passing through the recess 24, and a lifting mechanism for the lift pins, are provided at a location corresponding to the delivery position below the rotary table 2 (neither the lift pins nor the lifting mechanism are illustrated in the drawings).

Figure 6:
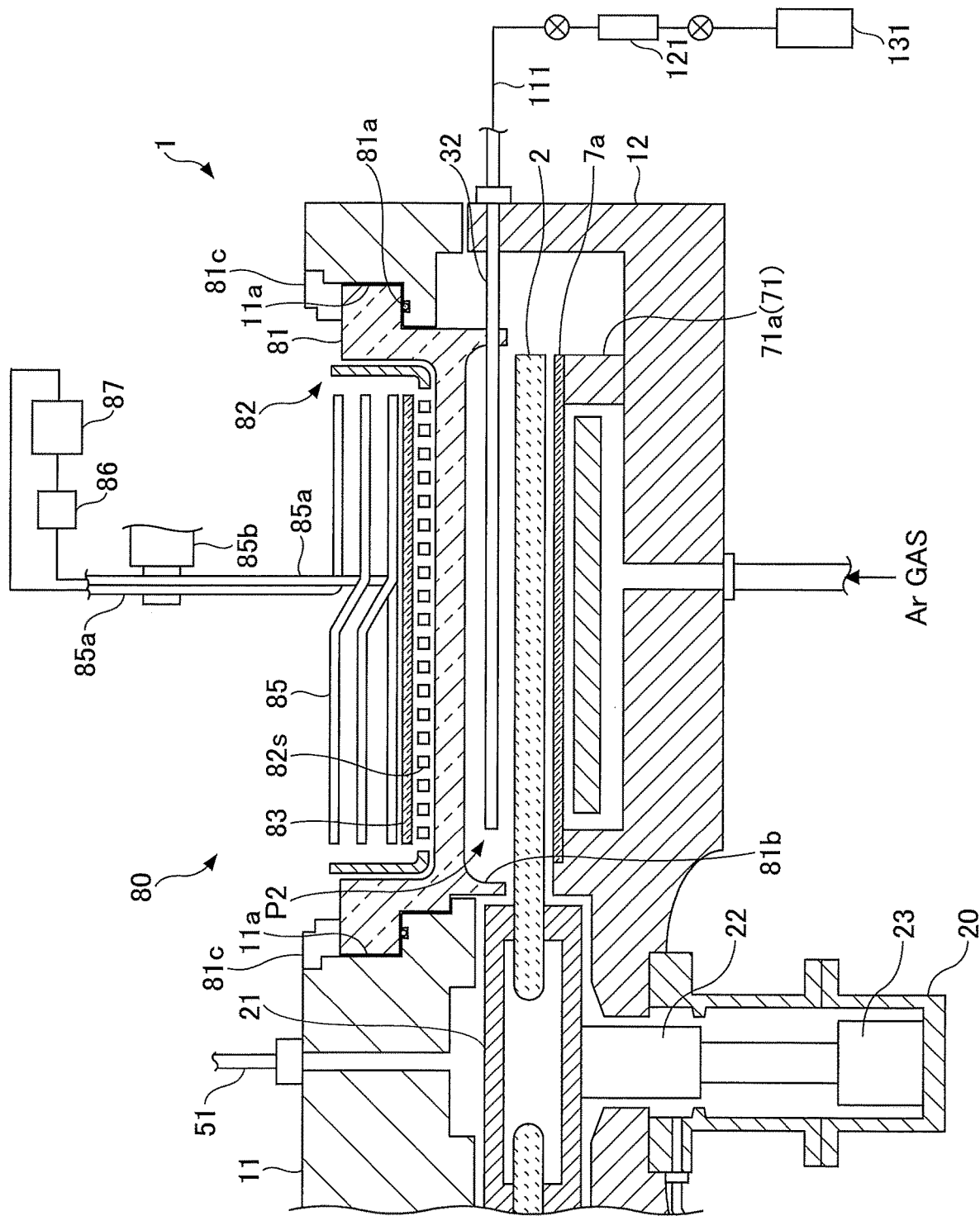
FIG. 6 is a schematic cross-sectional view of a plasma generator of the deposition apparatus used in the present embodiment.
Figure 7:
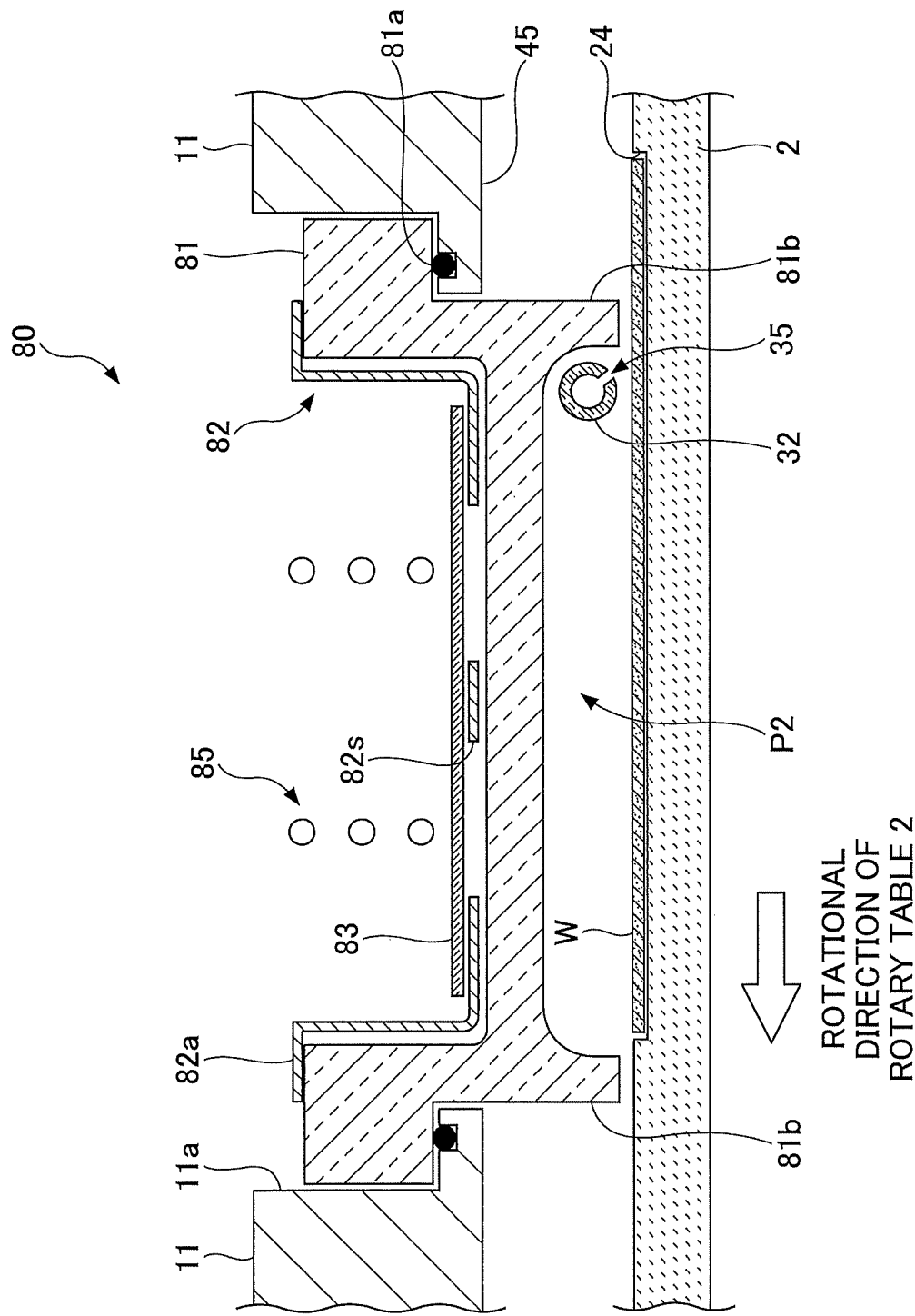
FIG. 7 is another schematic cross-sectional view of the plasma generator of the deposition apparatus used in the present embodiment.
Figure 8:
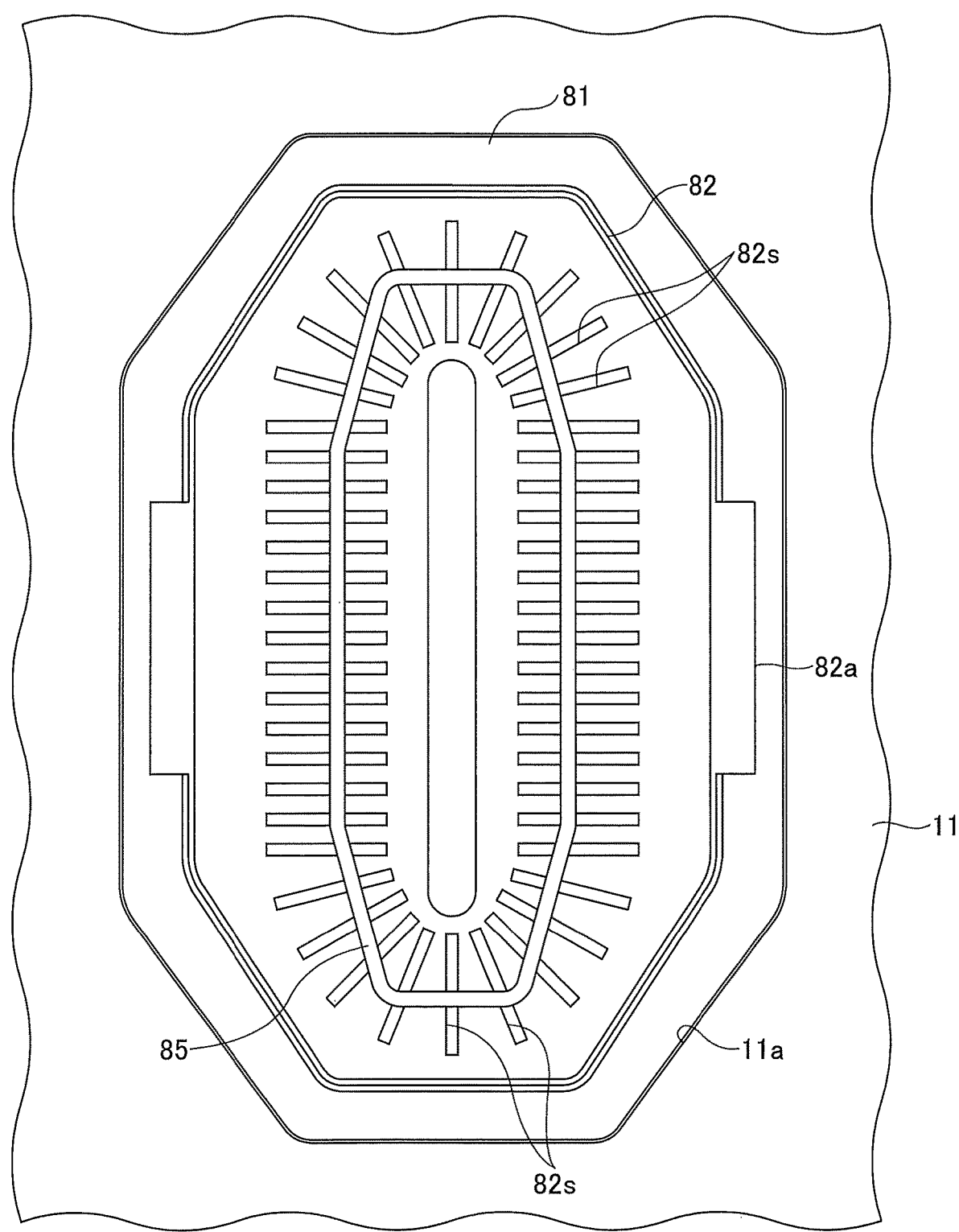
FIG. 8 is a schematic top view of the plasma generator of the deposition apparatus used in the present embodiment.

Next, the plasma generator 80 will be described with reference to FIGS. 6 to 8. FIG. 6 is a schematic cross-sectional view of the plasma generator 80 along a radial direction of the rotary table 2, FIG. 7 is a schematic cross-sectional view of the plasma generator 80 along a direction perpendicular to the radial direction of the rotary table 2, and FIG. 8 is a top view schematically illustrating the plasma generator 80. For the convenience of illustration, some members are simplified in these drawings.

Referring to FIG. 6, the plasma generator 80 includes a frame member 81 made from material allowing passage of high frequency electricity, a Faraday shield plate 82 of a substantially box-like shape, an insulating plate 83 disposed on the bottom surface of the Faraday shield plate 82, and a coiled antenna 85 that is supported above the insulating plate 83 and has a substantially octagonal shape in a plan view. The frame member 81 has a recess on its top surface, and is fitted into an opening 11a formed on the top plate 11. The Faraday shield plate 82 is housed in the recess of the frame member 81, and an upper surface of the Faraday shield plate 82 is opened.

The opening 11a of the top plate 11 has multiple steps, one step of which is formed with a groove around the entire circumference, and the groove is fitted with a sealing member 81a such as an O-ring. The frame member 81 has multiple steps corresponding to the steps of the opening 11a. When the frame member 81 is fitted into the opening 11a, a bottom surface of one of the steps of the frame member 81 contacts the sealing member 81a fitted into the groove of the opening 11a, thereby maintaining airtightness between the top plate 11 and the frame member 81. Further, as illustrated in FIG. 6, a pressing member 81c is provided along the outer periphery of the frame member 81 fitted into the opening 11a of the top plate 11, whereby the frame member 81 is pressed downward against the top plate 11. Therefore, the airtightness between the top plate 11 and the frame member 81 is more securely maintained.

A bottom surface of the frame member 81 faces the rotary table 2 in the vacuum vessel 1, and an outer periphery of the bottom surface of the frame member 81 is provided with a protruding portion 81b that protrudes downwardly (towards the rotary table 2) throughout an entire circumference of the bottom surface of the frame member 81. The lower surface of the protruding portion 81b is proximate to the surface of the rotary table 2, and a space (second processing region P2) is defined above the rotary table 2 by the protruding portion 81b, the surface of the rotary table 2, and the bottom surface of the frame member 81. The distance between the lower surface of the protruding portion 81b and the surface of the rotary table 2 may be approximately the same as the height h1 of the ceiling surface 44 from the upper surface of the rotary table 2 in the separation space H (FIG. 4).

Further, the reactant gas nozzle 32 extends into the second processing region P2, by penetrating the protruding portion 81b. In the present embodiment, as illustrated in FIG. 6, the nitriding gas supply source 131 filled with a nitriding gas is connected with the reactant gas nozzle 32 via a pipe 111, while interposing the flow controller 121 between the nitriding gas supply source 131 and the pipe 111. The nitriding gas whose flow rate is controlled by the flow controller 121 is activated by the plasma generator 80, and is supplied to the second processing region P2 at a predetermined flow rate.

The multiple discharge holes 35 are formed on the reactant gas nozzle 32 at predetermined intervals (e.g., 10 mm) along the longitudinal direction of the reactant gas nozzle 32, and the above-described nitriding gas is discharged from the discharge holes 35. As illustrated in FIG. 7, the discharge holes 35 are inclined from a direction perpendicular to the rotary table 2 toward an upstream side of the rotating direction of the rotary table 2. Accordingly, the gas supplied from the reactant gas nozzle 32 is discharged toward an opposite direction with respect to the rotating direction of the rotary table 2. Specifically, the gas is discharged toward a gap between the lower surface of the protruding portion 81b and the surface of the rotary table 2. This prevents reactant gas or separation gas from flowing into the second processing region P2 from the space under the ceiling surface 45 located at an upstream side of the plasma generator 80 along the rotating direction of the rotary table 2. Further, as described above, because the protruding portion 81b formed along the outer periphery of the bottom surface of the frame member 81 is proximate to the surface of the rotary table 2, the second processing region P2 can be easily maintained at high pressure by the gas supplied from the reactant gas nozzle 32. This also prevents reactant gas or separation gas from flowing into the second processing region P2.

As described above, the frame member 81 serves to separate the second processing region P2 from the third processing region P3. Accordingly, the deposition apparatus according to the present embodiment does not necessarily include an entirety of the plasma generator 80, but includes the frame member 81 for separating the second processing region P2 from the third processing region P3, to prevent reactant gas from entering.

The Faraday shield plate 82 is made of conductive material such as metal, and is grounded, although not illustrated. As clearly illustrated in FIG. 8, multiple slits 82s are formed at the bottom of the Faraday shield plate 82. Each of the slits 82s extends to a direction approximately perpendicular to a corresponding edge of the antenna 85 having a substantially octagonal planar shape.

The Faraday shield plate 82 has support portions 82a that bend outwardly at two points on the upper end, as illustrated in FIGS. 7 and 8. As the support portions 82a are supported on a top surface of the frame member 81, the Faraday shield plate 82 is supported at a predetermined position in the frame member 81.

The insulating plate 83 is made of quartz glass, for example. The insulating plate 83 is slightly smaller than the bottom surface of the Faraday shield plate 82, and is placed on the bottom surface of the Faraday shield plate 82. By the insulating plate 83, the Faraday shield plate 82 and the antenna 85 are electrically insulated, while high frequency power emitted from the antenna 85 passes downward.

The antenna 85 is formed by three windings of a copper hollow tube (pipe), for example, such that a planar shape is substantially octagonal. As cooling water can circulate in the pipe, the antenna 85 can be prevented from being heated to high temperature by high frequency power supplied to the antenna 85. In addition, the antenna 85 includes a vertical portion 85a, and the vertical portion 85a is mounted to a support member 85b. By the support member 85b, the antenna 85 is fixed at a predetermined position in the Faraday shield plate 82. Also, a high frequency power supply 87 is connected to the vertical portion 85a via a matching box 86. The high frequency power supply 87 can generate high frequency electric power of, for example, 13.56 MHz.

According to the plasma generator 80 configured as described above, an electromagnetic field is generated by the antenna 85 when high frequency power is supplied from the high frequency power supply 87 to the antenna 85 via a matching box 86. An electric field component of the electromagnetic field is shielded by the Faraday shield plate 82 and cannot be propagated downward. On the other hand, a magnetic field component passes through the multiple slits 82s of the Faraday shield plate 82, and is propagated into the second processing region P2. The magnetic field component activates the nitriding gas supplied from the reactant gas nozzle 32 to the second processing region P2 at a predetermined flow rate.

If chlorine gas is formed into plasma intensely, too strongly plasma-formed, an undercoat film UF may be etched. The plasma generator 80 using the antenna 85, which has been described with reference to FIGS. 6 to 8, is an inductively coupled plasma (ICP) generator, and is effective for generating plasma with high plasma intensity. However, in order to activate chlorine, it is preferable to use a plasma generator that generates less intense plasma. That is, although the supply of chlorine gas is intended to cause the chlorine gas to be adsorbed at high density to an upper portion of a recess pattern of a wafer W, and to generate adsorption inhibitors on the upper portion of the recess pattern, etching of the film is not intended. Therefore, plasma generation of the chlorine gas is performed without increasing the plasma intensity excessively, within a range where etching does not occur. The plasma generated in such a method can form adsorption inhibitors against the raw material gas on an upper portion of a recess pattern formed on a surface of a wafer W, such as a via or a trench, and by causing chlorine to be adsorbed, film deposition can be made to occur from a bottom portion of the recess pattern in which adsorption of the raw gas is not hindered by the adsorption inhibitors. The remote plasma generator 90 is suitable for generating a plasma with less intensity than that generated by the plasma generator 80. Thus, in the deposition apparatus according to the present embodiment, activation of chlorine gas in the third processing region P3 is performed using the remote plasma generator 90.

Figure 9:
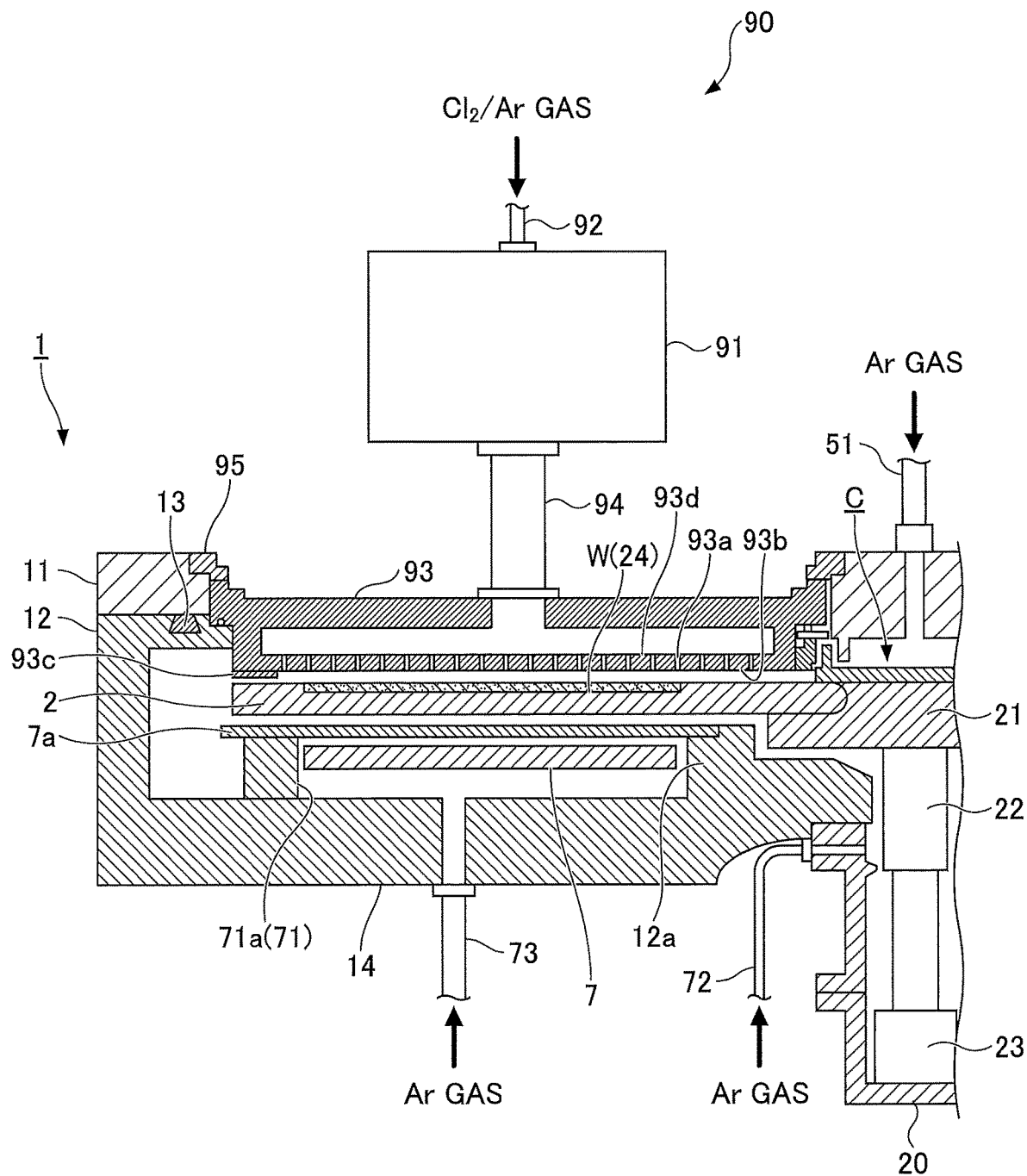
FIG. 9 is a schematic cross-sectional view of a remote plasma generator of the deposition apparatus used in the present embodiment.

FIG. 9 is a cross-sectional view of a portion of the deposition apparatus in which the remote plasma generator 90 according to the present embodiment is disposed.

As illustrated in FIG. 3 for example, the remote plasma generator 90 is disposed in the third processing region P3, and faces the rotary table 2, as illustrated in FIG. 9. The remote plasma generator 90 includes a plasma generating section 91, a gas supply line 92, a showerhead 93, and a pipe 94. The showerhead 93 is an example of a chlorine gas discharging section. Instead of the showerhead 93, a gas nozzle may be used for example.

The plasma generating section 91 activates chlorine gas supplied from the gas supply line 92 by a plasma source. The plasma source is not particularly limited as long as the plasma source is able to activate chlorine gas. For example, an inductively coupled plasma (ICP), a capacitively coupled plasma (CCP), or a surface wave plasma (SWP) can be used as the plasma source.

One end of the gas supply line 92 is connected to the plasma generating section 91 to supply chlorine gas to the plasma generating section 91. The other end of the gas supply line 92 is connected to the chlorine gas supply source 132 storing chlorine gas, via an open/close valve and a flow regulator, for example.

The showerhead 93 is connected to the plasma generating section 91 via the pipe 94, and supplies fluorine-containing gas activated by the plasma generating section 91 to the vacuum vessel 1. The showerhead 93 has a fan-like planar shape, and is pressed downwardly and circumferentially by a pressing member 95 formed along an outer periphery of the fan-like planar shape. Further, because the pressing member 95 is fixed to the top plate 11 by bolts or the like which is not illustrated, an inside of the vacuum vessel 1 is made to be an airtight state. In a state in which the showerhead 93 is fixed to the top plate 11, a distance between a lower surface of the showerhead 93 and the upper surface of the rotary table 2 may be, for example, from 0.5 mm to 5 mm.

Multiple gas discharge holes 93a are provided on the showerhead 93 such that a smaller number of the gas discharge holes 93a are provided at a side closer to the rotational center and a larger number of the gas discharge holes 93a are provided at a side closer to a periphery, to accommodate the velocity difference of the rotary table 2 at each location. The number of the multiple gas discharge holes 93a may be, for example, tens to hundreds. A diameter of each of the gas discharge holes 93a may be, for example, from 0.5 mm to 3 mm. The activated chlorine gas supplied to the showerhead 93 is supplied to a space between the rotary table 2 and the showerhead 93 through the gas discharge holes 93a.

Figure 10:
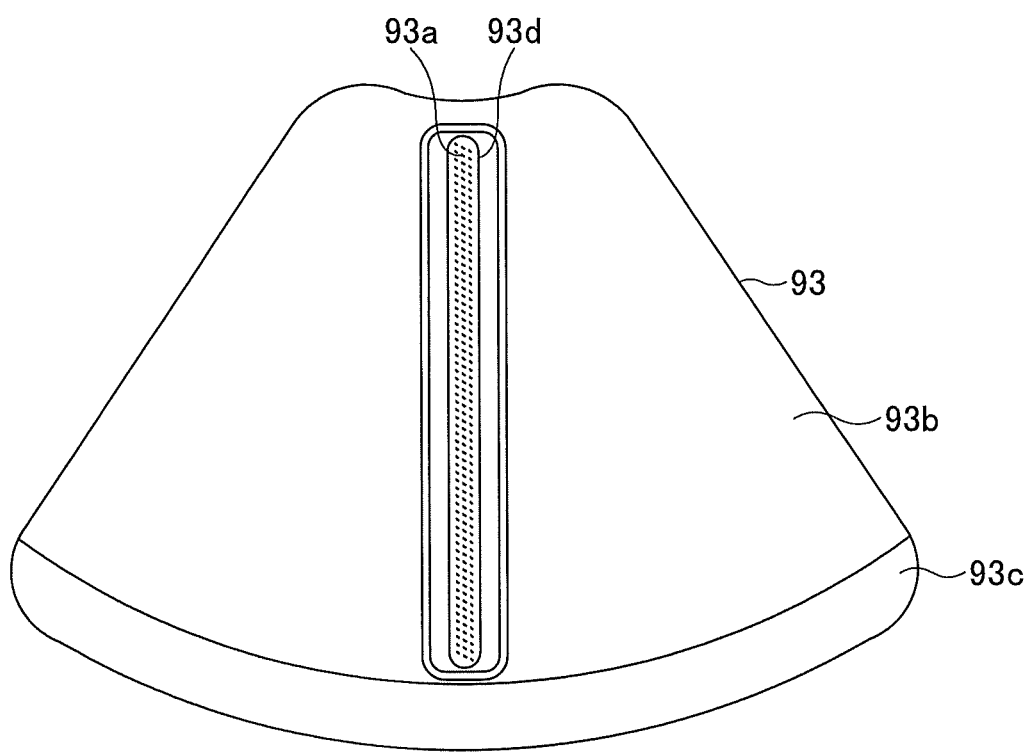
FIG. 10 is a plan view of a bottom surface of a showerhead of the remote plasma generator.

FIG. 10 is a plan view illustrating an example of a lower surface of the showerhead 93. As illustrated in FIG. 10, a downwardly projecting surface 93c may be provided in a form of a strip, along an outer periphery of the lower surface 93b of the fan-shaped showerhead 93. Accordingly, pressure decrease at the outer circumferential side of the third processing region P3 can be avoided uniformly in the circumferential direction. Also, the gas discharge holes 93a may be provided in a center portion of the lower surface 93b of the showerhead 93 so as to extend radially. Thus, chlorine gas supplied to the rotary table 2 can be dispersed from a center side to an outer circumferential side of the rotary table 2. In the present application, a portion in which the multiple gas discharge holes 93a are provided in the showerhead 93 may be referred to as the gas discharge section 93d.

By using the remote plasma generator 90 as described above, activated chlorine gas is supplied to a wafer W.

Further, as illustrated in FIG. 1, in the deposition apparatus that is used in the deposition method according to the present embodiment, a controller 100 having a computer for controlling an entire operation of the deposition apparatus is provided. In a memory of the controller 100, a program that causes the deposition apparatus to perform a deposition method to be described below under control of the controller 100 is stored. The program includes multiple steps for executing the deposition method to be described below. The program is stored in a recording medium 102 such as a hard disk, a compact disk, a magneto-optical disk, a memory card, or a flexible disk, and is read into a storage unit 101 by a predetermined reading device to be installed into the controller 100.

(Example of Deposition Method)

Figure 12A:
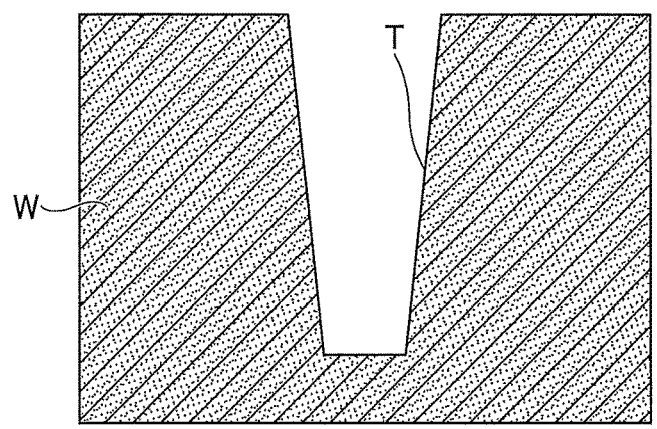
FIGS. 12A to 12E are diagrams illustrating a steps of depositing an SiN film.

Next, an example of a method of depositing an SiN film using the above-described deposition apparatus will be described with reference to FIG. 11 and FIGS. 12A to 12E. FIG. 11 is a flowchart illustrating an example of a process of the method of forming the SiN film, and FIGS. 12A to 12E schematically illustrate cross-sectional views of the wafer W in the film deposition process. In the description of the method of depositing the SiN film, a silicon wafer is used as the wafer W, and a trench T is formed on a surface of the silicon wafer as illustrated in FIG. 12A.

In addition, a case in which an SiN film is formed using the above-described deposition apparatus will be described. In this case, dichlorosilane (DCS, $SiH_2Cl_2$) is supplied from the reactant gas nozzle 31, ammonia ($NH_3$) is supplied as a nitriding gas from the reactant gas nozzle 32, and activated chlorine is supplied from the gas discharge section 93d of the remote plasma generator 90. The plasma generator 80 is also installed. The chlorine gas and the ammonia gas are supplied ionized or radicalized by activation.

First, as described in step 102 (S102 in FIG. 11), wafers W are placed in the five recesses 24 of the rotary table 2 in the vacuum vessel 1 of the above-described deposition apparatus. Specifically, a gate valve (not illustrated) of the above-described deposition apparatus is opened, and by using the conveying arm 10 (FIG. 3), the wafers W are passed from outside into the recesses 24 of the rotary table 2, through the conveying port 15 (FIGS. 2 and 3). This wafer transfer is accomplished by lifting and lowering the lift pins (not illustrated) from the bottom portion of the vacuum vessel 1 through the through-holes on the bottom surface of the recess 24 when one of the recesses 24 stops at a position facing the conveying port 15. Such transfer of a wafer W is performed by intermittently rotating the rotary table 2 and placing a wafer W in each of the five recesses 24 of the rotary table 2.

Next, as described in step 104 (S104 in FIG. 11), the vacuum vessel 1 of the above-described deposition apparatus is evacuated. Specifically, the gate valve of the above-described deposition apparatus is closed, and the vacuum vessel 1 is evacuated to a given vacuum level attainable by the vacuum pump 640.

Next, as described in step 106 (S106 in FIG. 11), an undercoat film UF formed of SiN is deposited on a surface of each of the wafers W on which the trench T is formed. Specifically, Ar gas as the separating gas is discharged from the separation gas nozzles 41 and 42 at a predetermined flow rate. Ar gas is also discharged from the separation gas supply line 51 and the purge gas supply lines 72 and 73 at a predetermined flow rate. Subsequently, a silicon-containing gas such as DCS is supplied from the reactant gas nozzle 31 (FIGS. 2 and 3), and ammonia gas is supplied from the reactant gas nozzle 32. The plasma generator 80 is also activated. Ammonia gas is activated by the plasma generator 80. Also, the inside of the vacuum vessel 1 is controlled to a predetermined processing pressure by the pressure controller 650 (FIG. 1). Then, the wafers W are heated to, for example, 400° C. by the heater unit 7 while rotating the rotary table 2 clockwise at, for example, rotational speed of 5 rpm. The rotational speed of the rotary table 2 can be set to various rotational speeds depending on the application. As described above, the DCS supplied from the reactant gas nozzle 31 reacts with the ammonia gas supplied from the reactant gas nozzle 32, and the undercoat film UF of SiN is formed.

Figure 12B:
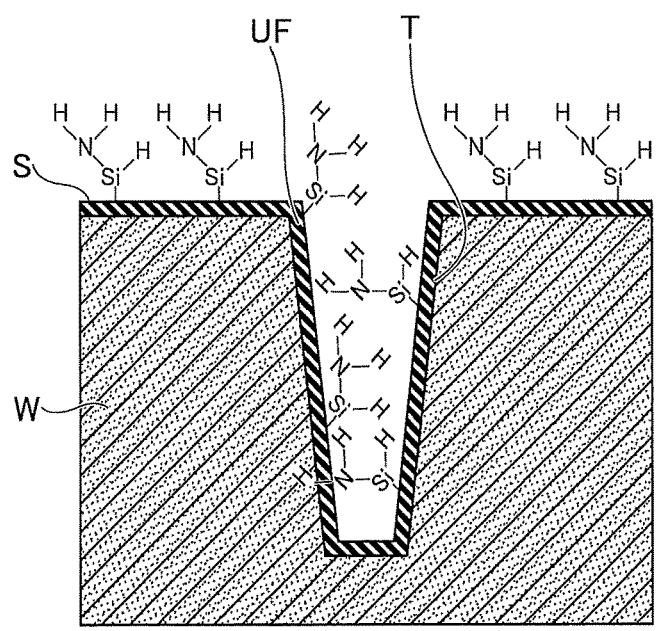

As the rotary table 2 rotates, the wafer W repeatedly passes through the third processing region P3, the separation region D, the first processing region P1, the separation region D, and the second processing region P2 in this order (see FIG. 3). This causes the undercoat film UF to be deposited on a surface of the wafer W on which the trench T is formed, including the bottom and side surfaces of the trench T, as illustrated in FIG. 12B. Although there is a wafer W in which processing starts from each of the regions P1 to P3 and D depending on a placed location on the rotary table 2, in the present embodiment, for convenience, the case in which the wafer W passes from the third processing region P3 will be described. The undercoat film UF formed is not a film with bottom-up property but a conformal film along the shape of the trench T. FIG. 12B illustrates a state immediately after passing through the second processing region P2, and a top surface of the undercoat film UF formed of SiN is terminated with an amino group of NH$_2$. This is because the wafer W is nitrided with the NH$_3$-containing gas as the wafer W passes through the second processing region P2. In addition, the separation region D may be referred to as a purge gas supply region in the present application.

Next, as described in step 108 (S108 in FIG. 11), an embedded film is formed to deposit SiN inside the trench T of the wafer W. Specifically, by supplying chlorine gas to the remote plasma generator 90 and by activating the remote plasma generator 90, activated chlorine is supplied from the gas discharge section 93d of the remote plasma generator 90.

Figure 12C:
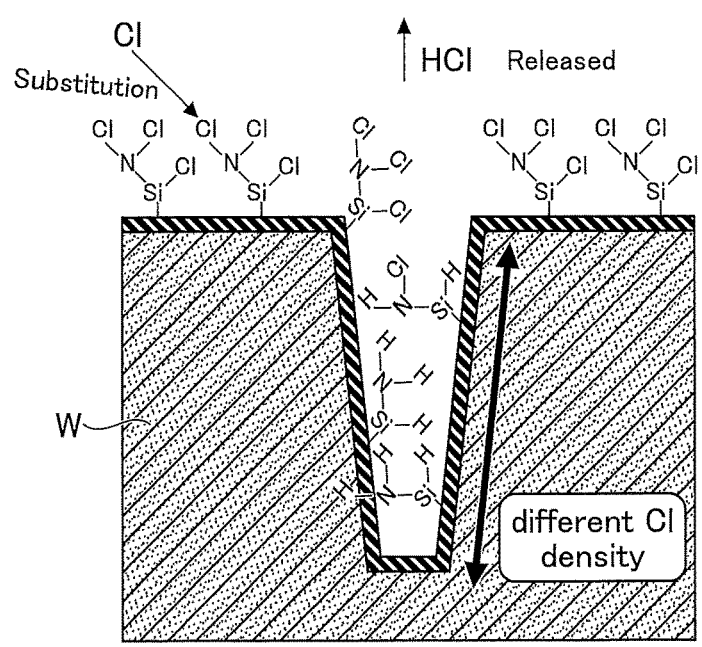

FIG. 12C illustrates an example of an adsorption inhibitor forming step. In the adsorption inhibitor forming step, when the wafer W passes through the third processing region P3, the plasma-activated chlorine gas (chlorine radical, chloride ion) is supplied to the undercoat film OF in the trench T. Thus, as illustrated in FIG. 12C, the (activated) chlorine gas reacts with an H atom to form HCl, and displaces an H atom (H group) of the amino group (NH$_2$) on the surface of the undercoat film UF. This Cl group on the surface of the undercoat film UF functions as an adsorption inhibitor against chlorine-containing gas. Here, chlorine gas easily reaches a surface S of the wafer W and an upper portion of the trench T, but does not easily reach a deep inside of the trench T, i.e., the lower part near the bottom. Because of the high aspect ratio of the trench T, most chlorine gas displaces H groups before reaching deep inside the trench T. Accordingly, Cl groups, which are adsorption inhibitors, are formed at high density on the surface S of the wafer W and the upper portion of the trench T, but a large number of amino groups of NH$_2$ structures remain at the lower portion of the trench T, resulting in a low density of Cl groups.

Figure 12D:
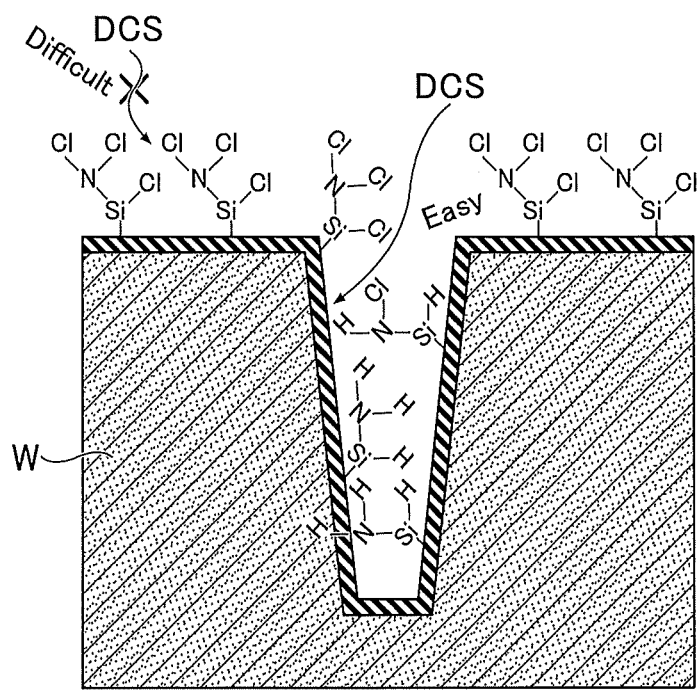

FIG. 12D is a diagram illustrating an example of a raw material gas adsorption step. In the raw material gas adsorption step, after the wafer W passes through the separation region D and purging is performed by supplying a purge gas, DCS is supplied to the wafer W as the wafer W passes through the first processing region P1. As illustrated in FIG. 12D, little DCS is adsorbed onto a region in which Cl groups as adsorption inhibitors are present, but a large amount of DCS is adsorbed to a region in which the adsorption inhibitor is absent. Accordingly, a large amount of DCS is adsorbed near the bottom inside of the trench T, and not much DCS is adsorbed on the surface S of the wafer W and on the upper portion of the trench T. That is, DCS as a raw material gas is adsorbed near the bottom of the trench T at high density, and DCS is adsorbed at low density on the upper portion of the trench T and on the surface of the wafer W.

Figure 12E:
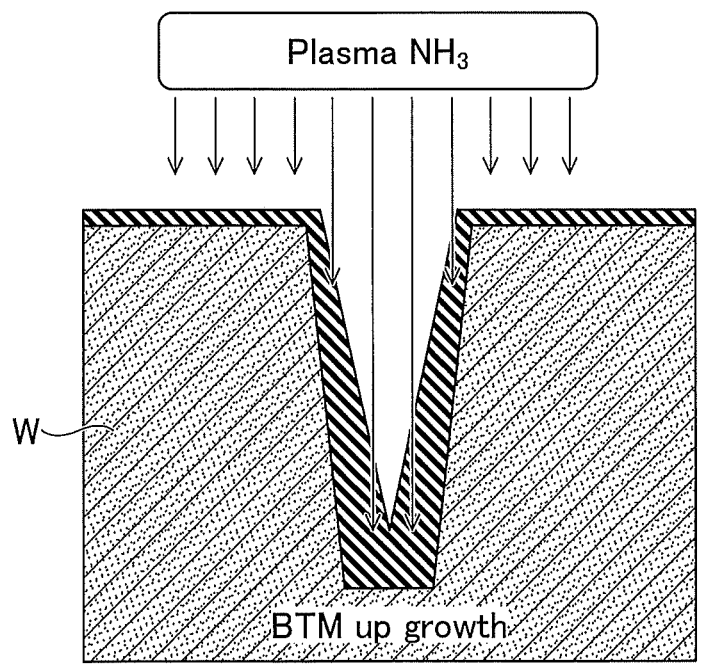

FIG. 12E illustrates an example of a nitride film deposition step. In the nitride film deposition step, after the wafer W passes through the separation region D and purging is performed by supplying a purge gas, plasma-activated NH$_3$ gas is supplied to the wafer W as the wafer W passes through the second processing region P2. Accordingly, as illustrated in FIG. 12E, by NH$_3$ gas being supplied, the supplied NH$_3$ gas reacts with the DCS adsorbed in the trench T, and an SiN film, which is a nitride film, is formed as a reaction product. Because more DCS is adsorbed to the bottom portion of the trench T, more SiN is formed at or near the bottom portion of the trench T. Therefore, deposition of an embedded film with high bottom-up property is realized, as illustrated in FIG. 12E.

Further, when the wafer W passes through the third processing region P3, the wafer W becomes in the state illustrated in FIG. 12C again. Cl groups as the adsorption inhibitors are adsorbed to the upper portion of the trench T and the surface of the wafer W.

Thereafter, by repeatedly rotating the rotary table 2 while supplying each reactant gas, a cycle composed of steps illustrated in FIGS. 12C to 12E is repeated, and the SiN film is deposited from the bottom without clogging the opening of the trench T. Accordingly, it is possible to perform deposition of an SiN film with high bottom-up property without blocking the opening, which can deposit the SiN film having a V-shaped cross-section, as illustrated in FIG. 12E. Finally, the trench T can be embedded with a seamless nitride film, and a high-quality nitride film can be embedded without generating a void.

Next, purging is performed as described in step 110 (S110 in FIG. 11). Specifically, the supply of DCS from the reactant gas nozzle 31 is stopped, and the supply of activated chlorine from the gas discharge section 93d is stopped by stopping the supply of chlorine to the remote plasma generator 90 and by stopping the remote plasma generator 90. In addition, the plasma generator 80 is stopped. Further, an operation in which Ar gas as a separating gas is discharged from the separation gas nozzles 41 and 42, the separation gas supply line 51, and the purge gas supply lines 72 and 73 at a predetermined flow rate, and in which ammonia gas is supplied from the reactant gas nozzle 32, is continued for 10 minutes. Note that Ar gas is supplied to the remote plasma generator 90. However, because the remote plasma generator 90 is not in operation, the Ar supplied to the remote plasma generator 90 is not activated.

Thereafter, pressure in the vacuum vessel 1 of the above-described deposition apparatus is returned to atmospheric pressure by controlled leaking, and the wafer W in which the embedded SiN film is deposited is unloaded from the vacuum vessel 1.

According to the above-described deposition method, selective film deposition with high bottom-up property can be performed by supplying activated chlorine gas to the upper portion of the trench T to form adsorption inhibitors while depositing films by ALD (Atomic Layer Deposition) method.

Note that plasma-activated $NH_3$ is not necessarily supplied. $NH_3$ that is not formed into plasma may be supplied if nitriding is possible.

According to the deposition method described above, an SiN film can be implanted from the bottom surface of the trench T, and a high-quality embedded film deposition is realized while suppressing occurrence of a void.

Meanwhile, the inventors have found that, in a case of depositing an SiN film in accordance with the above-described deposition method, a thickness of the deposited SiN film becomes thinner as the film deposition is repeated, that is, a film deposition rate of the SiN film decreases.

Figure 13:
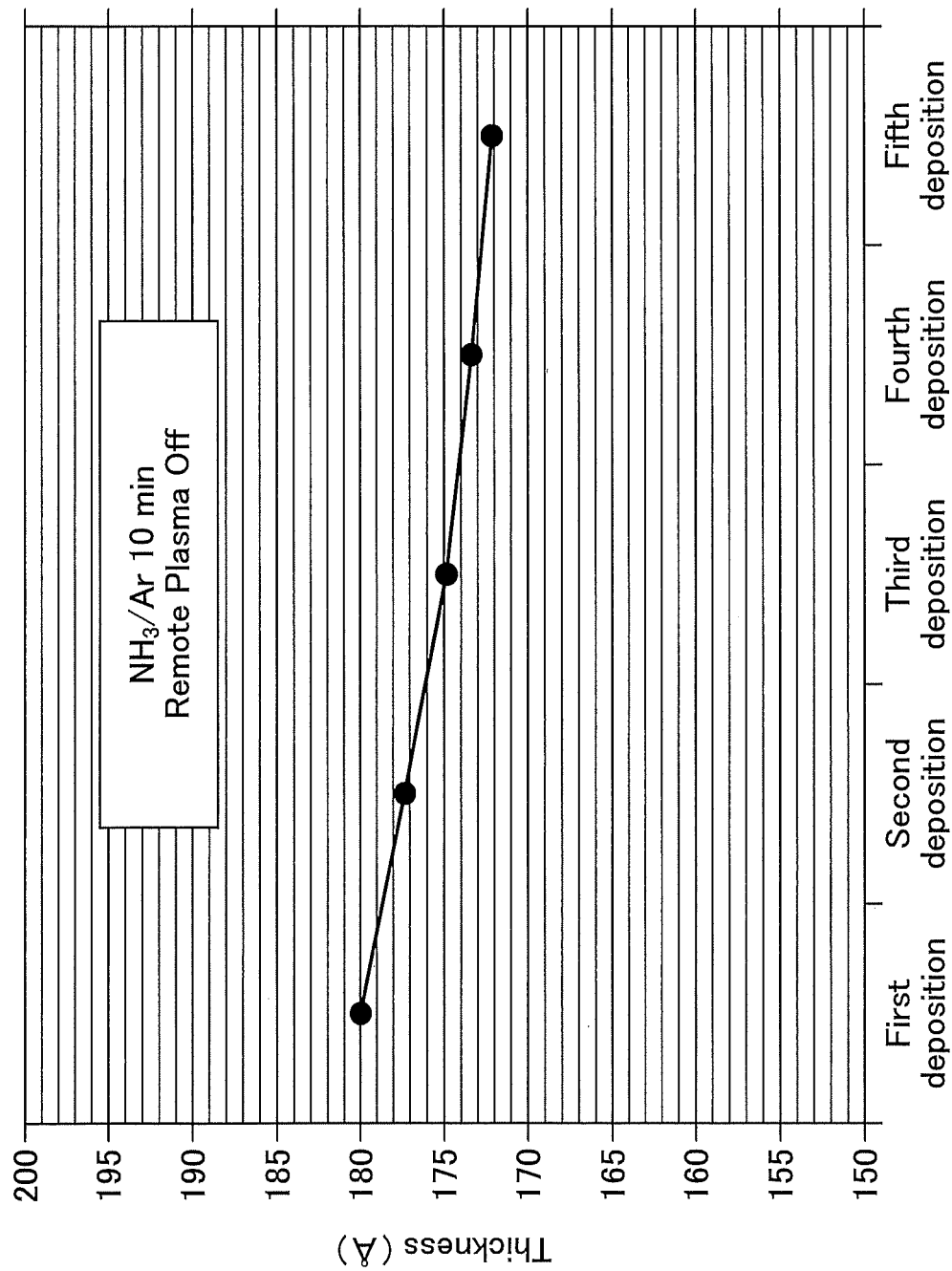
FIG. 13 is an explanatory view of a thickness of the SiN film formed according to the deposition method illustrated in FIG. 11.

Specifically, the inventors have found that, when a first film deposition process, a second film deposition process, a third film deposition process, a fourth film deposition process, and a fifth film deposition process, each of which is performed for the same time period, are sequentially carried out, a thickness of the deposited SiN film gradually decreases, as illustrated in FIG. 13. Note that in the case illustrated in FIG. 13, the thickness of the SiN was approximately 180 Å in a case of the first film deposition process, approximately 177 Å in a case of the second film deposition process, approximately 175 Å in a case of the third film deposition process, approximately 173.5 Å in a case of the fourth film deposition process, and approximately 172 Å in a case of the fifth film deposition process, with a ±2.3% variation.

Gradual decrease of the film deposition rate of the SiN film as a result of repeating film deposition as described above is not preferable, because quality of implantation of the SiN film into the trench T formed on the wafer W deteriorates, which leads to degradation of a throughput yield or the like. Therefore, there is a need for a deposition method that can stably deposit an SiN film with reproducibility without decreasing a film deposition rate of the SiN film even if the film deposition is repeated.

(Cause of Decrease in Film Deposition Rate)

The inventors investigated a reason for occurrence of decrease in film deposition rate over time in the above-described deposition method. As a result, the inventors have perceived that the decrease in film deposition rate occurs because chlorine adheres to a surface of the showerhead 93 of the remote plasma generator 90 and the chlorine adhering to the surface of the showerhead 93 cannot be removed during the above-described purge step (S110 in FIG. 11).

Figure 14A:
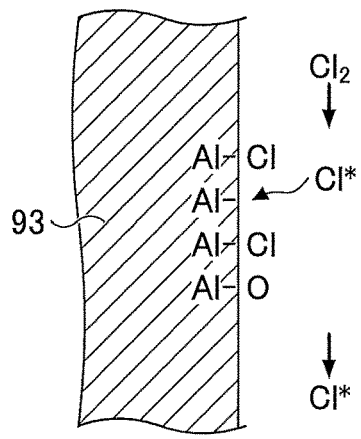
FIGS. 14A and 14B are explanatory views (1) of a surface state of the remote plasma generator.
Figure 14B:
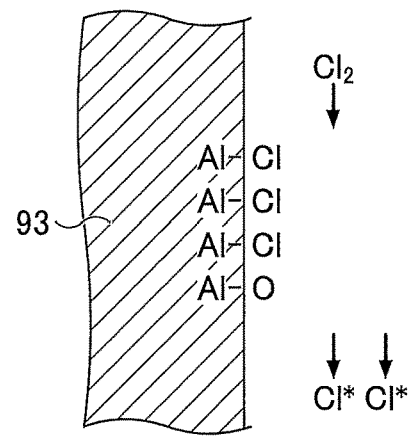

Specifically, the showerhead 93 or the like of the remote plasma generator 90 is formed of aluminum (Al), and chlorine gas is supplied to the showerhead 93 of the remote plasma generator 90 when an SiN film is formed. Because the supplied chlorine gas is activated by the remote plasma generator 90, the activated Cl is bonded to Al on a surface of the showerhead 93 and the like, as illustrated in FIG. 14A, to form AlCl bonded substances on the surface of the showerhead 93 and the like. Thus, when the AlCl bonded substances are formed on the surface of the showerhead 93 and the like, an amount of activated Cl adhering to the surface of the showerhead 93 and the like, when an SiN film is to be deposited, gradually decreases as illustrated in FIG. 14B. Thus, an amount of activated Cl supplied to the third processing region P3 gradually increases. Because the activated Cl acts as an adsorption inhibitor, a deposition rate of an SiN film to be deposited decreases as the activated Cl supplied to the third processing region P3 increases. It is assumed that a deposited thickness of the SiN film becomes thinner as the film deposition is repeated because of the phenomenon described above. Note that some remote plasma generators include anodized showerheads. In such a case, it is considered that O (oxygen) that is bonded to Al on the surface of the showerhead is replaced with activated Cl to form an AlCl bonded substance.

Figure 15A:
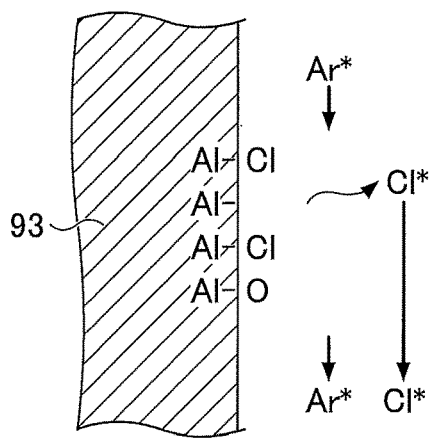
FIGS. 15A and 15B are explanatory views (2) of a surface state of the remote plasma generator.

As a result of consideration for solving the problem, the inventors have arrived at an idea of generating a plasma during the purge step. Specifically, in the purge step, Ar gas is supplied without chlorine gas being supplied. In such a state in which the Ar gas is supplied, a plasma is caused to be generated by the remote plasma generator 90. Thus, by generating a plasma in the purge step, Ar is activated as illustrated in FIG. 15A, and Cl bonded to Al on the surface of the showerhead 93 and the like is desorbed by the activated Ar. In the present application, this step is referred to as a plasma purge step.

Figure 15B:
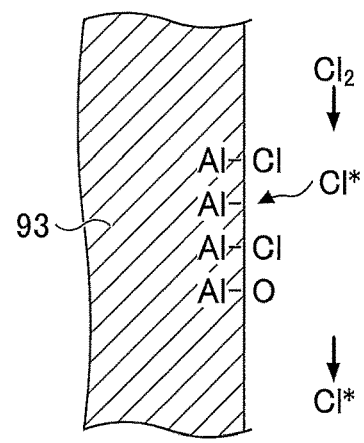

Thus, by causing desorption of Cl bonded to Al on the surface of the showerhead 93 and the like in the plasma purge step, Cl that is activated during deposition of the SiN film is bonded to Al on the surface of the showerhead 93 and the like, as illustrated in FIG. 15B. Therefore, the activated Cl supplied to the third processing region P3 does not increase. That is, because an amount of activated Cl supplied to the third processing region P3 becomes constant and stable, it is possible to prevent a deposited thickness of the SiN film from gradually becoming thinner each time the film deposition is performed, thereby SiN films can be deposited with high film thickness reproducibility.

Figure 16:
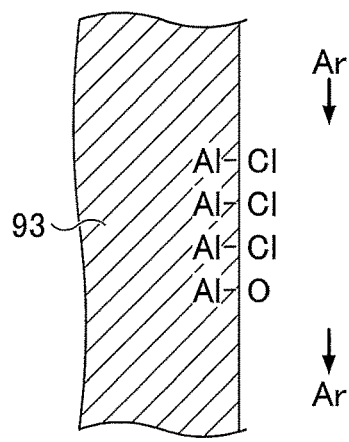
FIG. 16 is an explanatory view (3) of a surface state of the remote plasma generator.

In the purge step (step 110 in FIG. 11) of the deposition method described above, Ar gas is supplied. However, because a process of generating a plasma is not performed, the Ar is not activated. Therefore, as illustrated in FIG. 16, because Cl bonded to Al on the surface of the showerhead 93 and the like cannot be desorbed in the deposition method illustrated in FIG. 11, the SiN film gradually becomes thinner each time the film is formed.

(Deposition Method According to the Present Embodiment)

Figure 17:
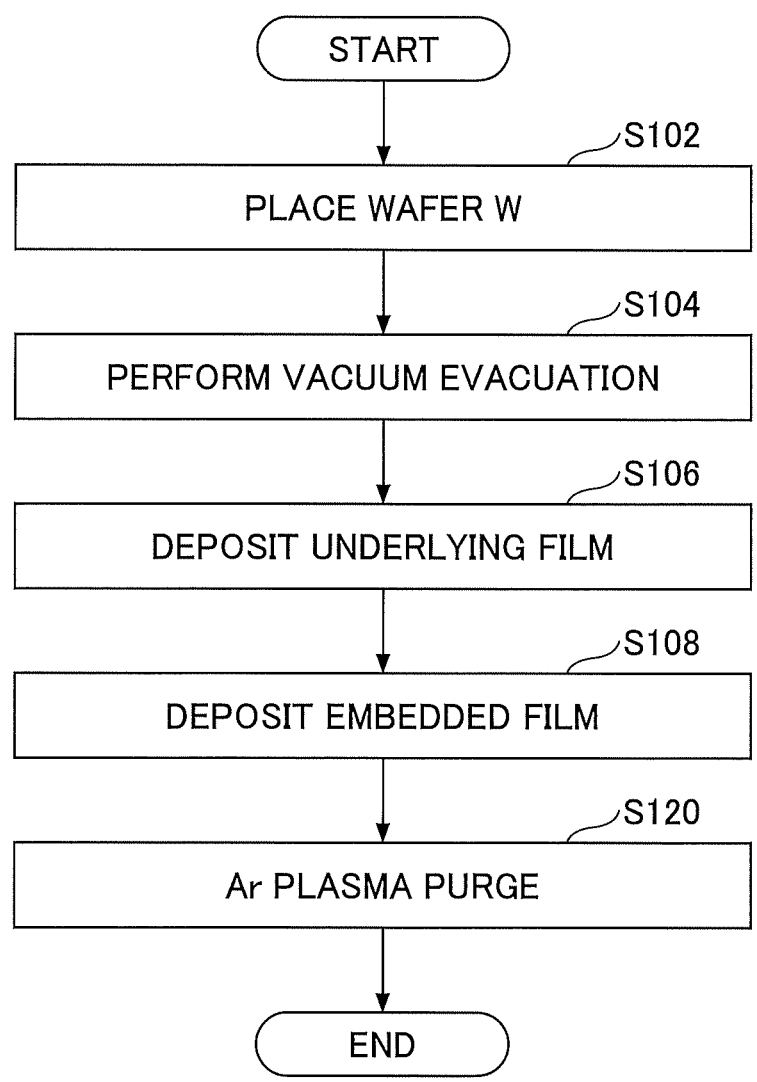
FIG. 17 is a flowchart illustrating a deposition method according to the present embodiment.

Next, a deposition method according to the present embodiment will be described. The deposition method according to the present embodiment is a method of depositing an SiN film using the above-described deposition apparatus, and will be described with reference to FIG. 17. FIG. 17 is a flowchart illustrating a process of forming an SiN film by a deposition method according to an embodiment.

First, as described in step 102 (S102), a wafer W is placed in each of the five recesses 24 of the rotary table 2 in the vacuum vessel 1 of the above-described deposition apparatus.

Next, as described in step 104 (S104), the vacuum vessel 1 of the above-described deposition apparatus is evacuated.

Next, as described in step 106 (S106), an undercoat film UF formed of SiN is deposited on a surface of each of the wafers W on which the trench T is formed.

Next, as described in step 108 (S108), an embedded film is formed to deposit SiN inside the trench T of the wafer W. Specifically, by supplying chlorine gas to the remote plasma generator 90 and by activating the remote plasma generator 90, activated chlorine is supplied from the gas discharge section 93d of the remote plasma generator 90.

Next, a plasma purge step is performed as described in step 120 (S120). Specifically, supply of DCS from the reactant gas nozzle 31 is stopped, supply of chlorine to the remote plasma generator 90 is stopped, and the remote plasma generator 90 is stopped. In addition, the plasma generator 80 is stopped. Further, an operation in which Ar gas as a separating gas is discharged from the separation gas nozzles 41 and 42, the separation gas supply line 51, and the purge gas supply lines 72 and 73 at a predetermined flow rate, and in which ammonia gas is supplied from the reactant gas nozzle 32, is continued for 10 minutes. Because the remote plasma generator 90 is operating, the Ar supplied to the remote plasma generator 90 is activated.

Thereafter, pressure in the vacuum vessel 1 of the above-described deposition apparatus is returned to atmospheric pressure by controlled leaking, and the wafer W in which the embedded SiN film is deposited is unloaded from the vacuum vessel 1.

Note that plasma-activated $NH_3$ is not necessarily supplied. $NH_3$ that is not formed into plasma may be supplied if nitriding is possible.

Figure 18:
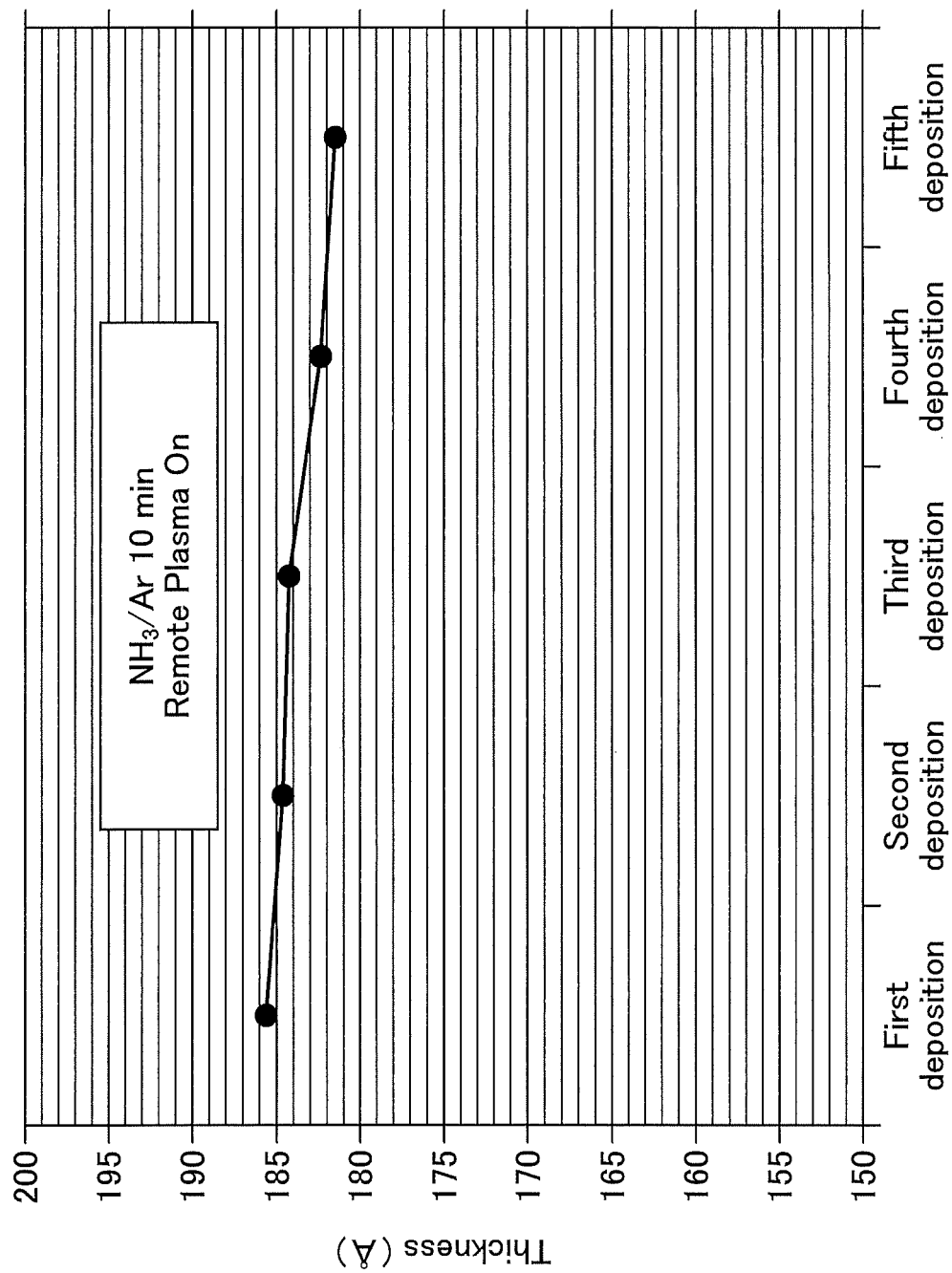
FIG. 18 is an explanatory view of a thickness of the SiN film formed by the deposition method according to the present embodiment.

An SiN film deposited by the deposition method according to the present embodiment will be described. Specifically, a first film deposition process, a second film deposition process, a third film deposition process, a fourth film deposition process, and a fifth film deposition process were carried out sequentially in the same time period, in accordance with the deposition method according to the present embodiment. A period of time of executing each of these five film deposition processes was the same. As illustrated in FIG. 18, a thickness of the SiN film thickness was approximately 186 Å in a case of the first film deposition process, approximately 184.5 Å in a case of the second film deposition process, approximately 184 Å in a case of the third film deposition process, approximately 182 Å in a case of the fourth film deposition process, and approximately 181.5 Å in a case of the fifth film deposition process, with a ±1.2% variation.

Therefore, in the deposition method according to the present embodiment, the variation in SiN film thickness can be reduced to approximately half, as compared to the case illustrated in FIG. 13. Therefore, even if the SiN film deposition is repeated, the deposited film thickness does not become much thinner, and decrease in film deposition rate can be suppressed, thereby allowing the film thickness reproducibility to be improved.

Furthermore, the SiN film formed in accordance with the deposition method in the present embodiment is thicker by approximately 4.6% than that illustrated in FIG. 13. That is, a film deposition rate is higher by approximately 4.6% than the case illustrated in FIG. 13. Therefore, the deposition method according to the present embodiment can improve an SiN film deposition throughput.

Although a case in which the deposition method includes a step of depositing an undercoat film has been described above, a wafer W on which an undercoat film UF has already been deposited on the surface may be used. In such a case, execution of step 106 may be omitted from the deposition method, and step 102, step 104, step 108, and step 120 are executed in the deposition method in an order of step 102, step 104, step 108, and step 120. The undercoat film UF may be a silicon oxide film, in addition to a silicon nitride film.

In the deposition method according to the present embodiment, an example in which a silicon nitride film was deposited has been described. However, it is possible to form a metal nitride film, such as TiN or AlN, by using a gas including a metal and chlorine, such as $TiCl_4$ or $AlCl_3$, as a raw material gas. Also, with respect to a type of a metallic element contained in a raw material gas, in addition to Ti or Al, various types of metallic elements, such as zirconium (Zr) or hafnium (Hf) may be contained, and by using a raw material gas containing such a metallic element, a metal nitride film of various types of metallic elements can be embedded.

While the preferred embodiments of the present invention have been described in detail, the invention is not limited to the embodiments described above, and various modifications and substitutions can be made to the above-described embodiments without departing from the scope of the invention.

What is claimed is:

1. A deposition method comprising:
    forming a nitride film on a surface of a substrate; and
    performing, after the forming of the nitride film, plasma purging supplying a noble gas activated as a plasma;
    wherein the forming includes
    a) forming adsorption inhibitors on the surface of the substrate, by supplying a chlorine gas activated as a plasma and by causing the activated chlorine gas to be adsorbed on the surface of the substrate;
    b) causing a raw material gas to be adsorbed on a region in the surface of the substrate on which the adsorption inhibitors are not present by supplying the raw material gas on the surface of the substrate, the raw material gas being a gas containing silicon and chlorine, or a gas containing a metal and chlorine; and
    c) depositing the nitride film on the surface of the substrate, by supplying a nitriding gas to cause the raw material gas to be reacted with the nitriding gas,
    wherein the forming of the nitride film repeats a set of step a), step b), and step c) a predetermined number of times, and
    wherein the plasma purging is performed by activating Ar gas so as to desorb Cl bonded to a surface of a showerhead.

2. The deposition method according to claim 1, wherein the metal is titanium or aluminum.

3. The deposition method according to claim 1, wherein the substrate is a silicon substrate.

4. The deposition method according to claim 1, wherein a recess pattern is formed on the substrate; and
    in the forming of the nitride film, the nitride film is embedded in the recess pattern.

5. The deposition method according to claim 1, wherein an undercoat film is formed on the substrate in advance.

6. The deposition method according to claim 5, wherein the undercoat film is a silicon nitride film or a silicon oxide film.

7. The deposition method according to claim 1, further comprising forming an undercoat film,
    wherein the forming of the undercoat film is performed before the forming of the nitride film; and the forming of the undercoat film includes d) causing a silicon-containing gas to be adsorbed on the surface of the substrate, by supplying the silicon-containing gas; and e) supplying a nitriding gas on the surface of the substrate to cause a silicon nitride film to be deposited on the surface of the substrate, by the nitriding gas being reacted with the silicon-containing gas.

8. The deposition method according to claim 7, wherein the undercoat film is formed by repeating a set of step d) and step e) a predetermined number of times.

9. The deposition method according to claim 1, wherein the nitriding gas is activated as a plasma.

10. The deposition method according to claim 1, wherein the substrate is placed on a rotary table, along a circumferential direction of the rotary table;

a nitriding gas supplying region, a chlorine gas supplying region, and a raw material gas supplying region are disposed above the rotary table at intervals, each of which are arranged along a rotating direction of the rotary table in an order of the nitriding gas supplying region, the chlorine gas supplying region, and the raw material gas supplying region; and by rotating the rotary table, step a), step b), and step c) are preformed repeatedly.

11. The deposition method according to claim 10, wherein a purge gas supply region is provided between the chlorine gas supplying region and the raw material gas supplying region, and between the raw material gas supplying region and the nitriding gas supplying region, the purge gas supply region being configured to supply a purge gas onto the surface of the substrate; and the purge gas is supplied after step a) and before step b), and after step b) and before step c).

12. The deposition method according to claim 1, wherein the chlorine gas is activated as a plasma generated by a remote plasma generator; and the plasma purging is performed by the remote plasma generator.

13. The deposition method according to claim 1, wherein the plasma purging is performed by supplying the argon gas from a separation gas nozzle and supplying only ammonia gas from a reaction gas nozzle.

* * * * *